(12) United States Patent
Uchino et al.

(10) Patent No.: US 12,108,614 B2
(45) Date of Patent: Oct. 1, 2024

(54) PHOTOELECTRIC CONVERSION ELEMENT AND SOLID-STATE IMAGING DEVICE

(71) Applicants: SONY GROUP CORPORATION, Tokyo (JP); SONY SEMICONDUCTOR SOLUTIONS CORPORATION, Kanagawa (JP)

(72) Inventors: Naoki Uchino, Kanagawa (JP); Yosuke Murakami, Kanagawa (JP); Miki Kimijima, Tokyo (JP); Toshio Nishi, Kanagawa (JP)

(73) Assignees: SONY GROUP CORPORATION, Tokyo (JP); SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 319 days.

(21) Appl. No.: 17/671,311

(22) Filed: Feb. 14, 2022

(65) Prior Publication Data

US 2022/0165800 A1 May 26, 2022

Related U.S. Application Data

(63) Continuation of application No. 16/763,611, filed as application No. PCT/JP2018/042417 on Nov. 16, 2018, now Pat. No. 11,322,547.

(30) Foreign Application Priority Data

Nov. 20, 2017 (JP) .................. 2017-222977

(51) Int. Cl.
*H01L 27/146* (2006.01)
*H10K 30/00* (2023.01)
*H10K 39/32* (2023.01)

(52) U.S. Cl.
CPC .......... *H10K 39/32* (2023.02); *H10K 30/451* (2023.02)

(58) Field of Classification Search
CPC ...... H10K 39/32; H10K 30/451; H10K 30/40; H10K 85/211; H10K 85/311;
(Continued)

(56) References Cited

U.S. PATENT DOCUMENTS

2007/0194400 A1 8/2007 Yokoyama
2010/0065829 A1 3/2010 Forrest et al.
(Continued)

FOREIGN PATENT DOCUMENTS

CN 104934453 A 9/2015
JP 2007-059457 3/2007
(Continued)

OTHER PUBLICATIONS

International Search Report and Written Opinion for International (PCT) Patent Application No. PCT/JP2018/042417, dated Feb. 19, 2019.
(Continued)

*Primary Examiner* — Samuel Park
(74) *Attorney, Agent, or Firm* — SHERIDAN ROSS P.C.

(57) ABSTRACT

A photoelectric conversion element according to an embodiment of the present disclosure includes: a first electrode; a second electrode disposed to be opposed to the first electrode; and an organic photoelectric conversion layer provided between the first electrode and the second electrode. The organic photoelectric conversion layer has a domain of one organic semiconductor material therein. The domain of the one organic semiconductor material has a percolation structure in which the domain vertically extends in the organic photoelectric conversion layer in a film-thickness direction, and has a smaller domain length in a plane
(Continued)

direction of the organic photoelectric conversion layer than a domain length in the film-thickness direction of the organic photoelectric conversion layer.

12 Claims, 16 Drawing Sheets

(58) Field of Classification Search
 CPC ........... H10K 85/6576; H10K 30/30; H01L 27/14609; H01L 27/14636; H01L 27/14643; H01L 27/14665; H01L 27/1464; H01L 27/14647; H01L 31/10; Y02E 10/549
 See application file for complete search history.

(56) References Cited

U.S. PATENT DOCUMENTS

| | | |
|---|---|---|
| 2010/0078066 A1 | 4/2010 | Darling et al. |
| 2014/0079936 A1 | 3/2014 | Russo et al. |
| 2015/0188065 A1 | 7/2015 | Takimoto |
| 2017/0048500 A1 | 2/2017 | Shi |
| 2017/0062746 A1* | 3/2017 | Sawaki ............... H01L 31/10 |
| 2019/0257959 A1 | 8/2019 | Thirimanne et al. |
| 2020/0365660 A1 | 11/2020 | Uchino et al. |

FOREIGN PATENT DOCUMENTS

| | | |
|---|---|---|
| JP | 2007527605 A | 9/2007 |
| JP | 2008-258421 | 10/2008 |
| JP | 2009-060053 | 3/2009 |
| JP | 2013183056 A | 9/2013 |
| JP | 2014-017321 | 1/2014 |
| JP | 2014-029904 | 2/2014 |
| JP | 2014-515695 | 7/2014 |
| JP | 2017157801 A * | 9/2017 |
| WO | WO 2012/129283 | 9/2012 |
| WO | WO 2014/021177 | 2/2014 |
| WO | WO-2014156184 A1 | 10/2014 |
| WO | WO 2016/203925 | 12/2016 |
| WO | WO-2016194630 A1 | 12/2016 |
| WO | WO-2016203925 A1 * | 12/2016 |
| WO | WO-2017159684 A1 | 9/2017 |

OTHER PUBLICATIONS

Almantas Pivrikas et al., Influence of processing additives to nano-morphology and efficiency of bulk-heterojunction solar cells: A comparative review, Solar Energy, 85, (2011), 1226 (Dec. 21, 2010).

He. M. [et al.]: Conjugated rod-coil and rod-rod block copolymers for photovoltaic applications. In: Journal Materials Chemistry, vol. 21, Nov. 21, 2011, pp. 17039-17048.

Zhang, G. [et al.]:Thermal annealing effect on organic semiconducting polymer laser with an external holographic grating feedback layer In: Organic Electronics vol. 43, 2017, S. 148-155.

* cited by examiner

EXPERIMENT EXAMPLE 1
(A)

EXPERIMENT EXAMPLE 4
(B)

EXPERIMENT EXAMPLE 6

(A)

EXPERIMENT EXAMPLE 8

(B)

PHOTOELECTRIC CONVERSION ELEMENT AND SOLID-STATE IMAGING DEVICE

CROSS REFERENCE TO RELATED APPLICATIONS

This application is a continuation of U.S. patent application Ser. No. 16/763,611, filed May 13, 2020, which is a national stage application under 35 U.S.C. 371 and claims the benefit of PCT Application No. PCT/JP2018/042417 having an international filing date of 16 Nov. 2018, which designated the United States, which PCT application claimed the benefit of Japanese Patent Application No. 2017-222977 filed 20 Nov. 2017, the entire disclosures of each of which are incorporated herein by reference.

TECHNICAL FIELD

The present disclosure relates to a photoelectric conversion element and a solid-state imaging device including this.

BACKGROUND ART

In recent years, devices including organic thin films have been developed. One of such devices is an organic photoelectric conversion element. There has been proposed an organic thin-film solar cell, an organic imaging element, or the like including the organic photoelectric conversion element. A bulk heterostructure is adopted in the organic photoelectric conversion element to increase external quantum efficiency. In bulk heterostructure, a p-type organic semiconductor and an n-type organic semiconductor are mixed. However, the organic photoelectric conversion element has a problem that it is not possible to obtain sufficient external quantum efficiency due to a low conductive characteristic of an organic semiconductor. In addition, the organic imaging element has a problem that an electric output signal is easily delayed with respect to incident light.

In general, it has been found that molecular orientation is important for conduction of an organic semiconductor. The same applies to an organic photoelectric conversion element having a bulk heterostructure. For this reason, in an organic photoelectric conversion element in which a conduction direction is perpendicular to a substrate, it is preferable that the organic semiconductor be oriented parallel with the substrate. In contrast, for example, PTL 1 discloses a photoelectric conversion element including an organic semiconductor compound having horizontal orientation. For example, PTL 2 discloses an organic thin-film solar cell in which an orientation control layer is provided in a lower layer of an i-layer. For example, PTL 3 discloses a method of manufacturing an organic photoelectric conversion element that controls the orientation of a photoelectric conversion layer by controlling a substrate temperature to form a film.

CITATION LIST

Patent Literature

PTL 1: Japanese Unexamined Patent Application Publication No. 2009-60053
PTL 2: Japanese Unexamined Patent Application Publication No. 2007-59457
PTL 3: Japanese Unexamined Patent Application Publication No. 2008-258421

SUMMARY OF THE INVENTION

Problems to be Solved by the Invention

As described above, the photoelectric conversion element including an organic semiconductor material is requested to increase the external quantum efficiency and response speed.

It is desirable to provide a photoelectric conversion element and a solid-state imaging device that each make it possible to increase external quantum efficiency and response speed.

A photoelectric conversion element according to an embodiment of the present disclosure includes: a first electrode; a second electrode disposed to be opposed to the first electrode; and an organic photoelectric conversion layer provided between the first electrode and the second electrode. The organic photoelectric conversion layer has a domain of one organic semiconductor material therein. The domain of the one organic semiconductor material has a percolation structure in which the domain vertically extends in the organic photoelectric conversion layer in a film-thickness direction, and has a smaller domain length in a plane direction of the organic photoelectric conversion layer than a domain length in the film-thickness direction of the organic photoelectric conversion layer.

A solid-state imaging device according to an embodiment of the present disclosure includes pixels each including one or more organic photoelectric conversion sections, and includes the above-described photoelectric conversion element according to the embodiment of the present disclosure as the organic photoelectric conversion section.

In each of the photoelectric conversion element according to the embodiment of the present disclosure and the solid-state imaging device according to the embodiment of the present disclosure, the organic photoelectric conversion layer provided between the first electrode and the second electrode includes the one organic semiconductor material that forms the domain having the predetermined shape in the layer. The domain of this one organic semiconductor material has the percolation structure in which the domain vertically extends in the organic photoelectric conversion layer in the film-thickness direction, and has the smaller domain length in the plane direction of the organic photoelectric conversion layer than the domain length in the film-thickness direction. This makes it possible to appropriately control a mixture state of organic semiconductor materials included in the organic photoelectric conversion layer.

The photoelectric conversion element according to the embodiment of the present disclosure and the solid-state imaging device according to the embodiment of the present disclosure each includes the one organic semiconductor material that forms the domain as described above in the layer, and the organic semiconductor materials included in the organic photoelectric conversion layer are thus controlled in the appropriate mixture state. This makes it possible to increase the external quantum efficiency and response speed.

It is to be noted that the effects described here are not necessarily limited, but any of effects described in the present disclosure may be included.

MODES FOR CARRYING OUT THE INVENTION

The following describes embodiments of the present disclosure in detail with reference to the drawings. The following description is a specific example of the present disclosure, but the present disclosure is not limited to the following embodiment. In addition, the present disclosure does not limit the disposition, dimensions, dimension ratios, and the like of respective components illustrated in the diagrams thereto. It is to be noted that description is given in the following order.

1. Embodiment (A photoelectric conversion element in which an organic photoelectric conversion layer includes one organic semiconductor material that forms a domain having a predetermined shape)
1-1. Configuration of Photoelectric Conversion Element
1-2. Method of Manufacturing Photoelectric Conversion Element
1-3. Workings and Effects
2. Modification Example (A photoelectric conversion element in which a plurality of organic photoelectric conversion sections is stacked)
3. Application Examples
4. Working Examples

1. Embodiment

Figure 1:
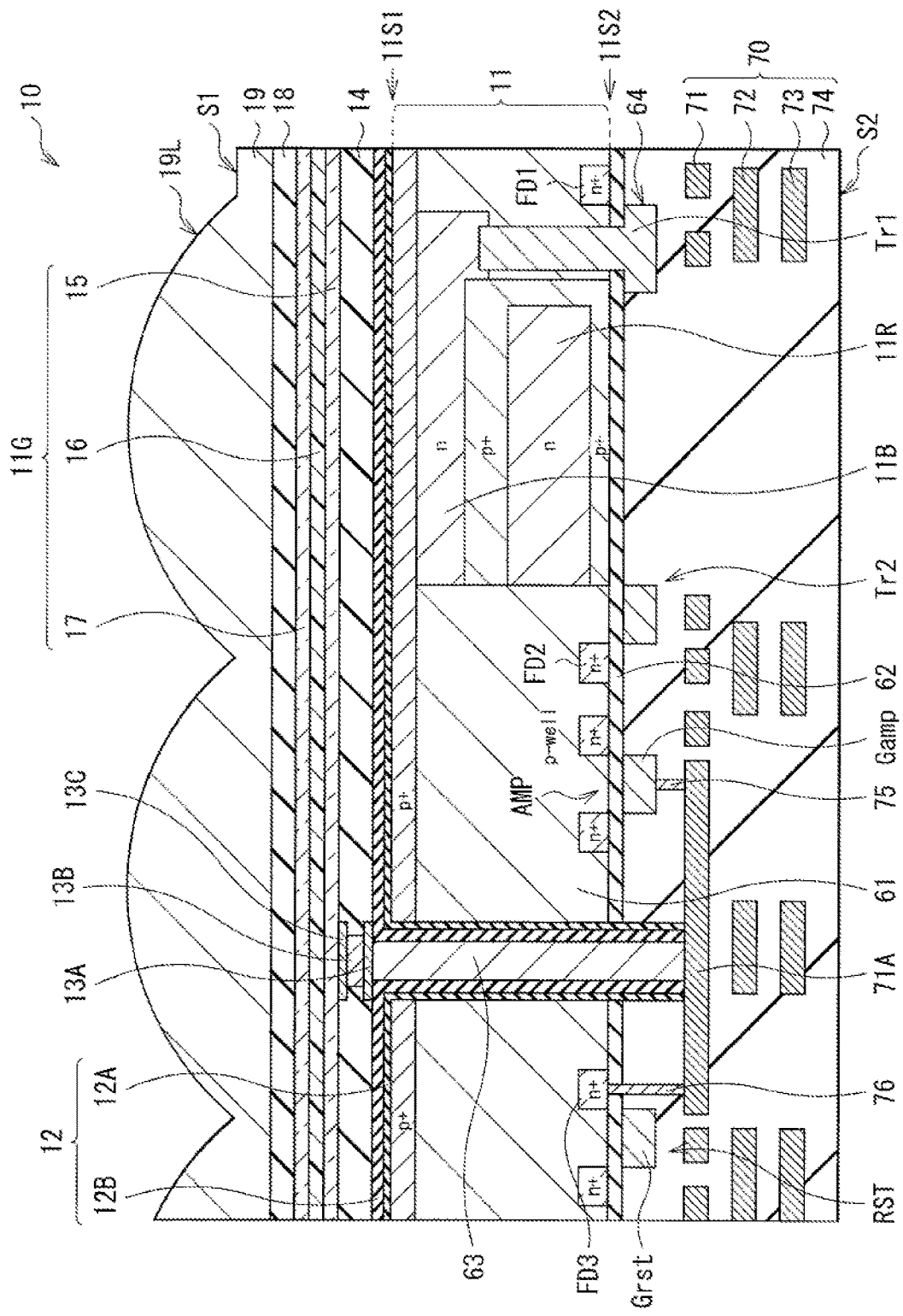
FIG. 1 is a schematic cross-sectional view of a configuration of a photoelectric conversion element according to an embodiment of the present disclosure.

FIG. 1 illustrates a cross-sectional configuration of a photoelectric conversion element (photoelectric conversion element 10) according to an embodiment of the present disclosure. The photoelectric conversion element 10 is included, for example, in one pixel (unit pixel P) in a solid-state imaging device (solid-state imaging device 1) such as a backside illumination type (backside light receiving type) CCD (Charge Coupled Device) image sensor or CMOS (Complementary Metal Oxide Semiconductor) image sensor (see FIG. 8). The photoelectric conversion element 10 is of a so-called vertical spectroscopic type in which one organic photoelectric conversion section 11G, and two inorganic photoelectric conversion sections 11B and 11R are stacked in a vertical direction. The organic photoelectric conversion section 11G, and the two inorganic photoelectric conversion sections 11B and 11R each selectively detect respective pieces of light in different wavelength regions to perform photoelectric conversion. In the present embodiment, an organic photoelectric conversion layer 16 included in the organic photoelectric conversion section 11G has a configuration in which the organic photoelectric conversion layer 16 is formed by using an organic semiconductor material (one organic semiconductor material). The organic semiconductor material (one organic semiconductor material) forms a domain having a predetermined shape in the layer.

(1-1. Configuration of Photoelectric Conversion Element)

In the photoelectric conversion element 10, one organic photoelectric conversion section 11G, and two inorganic photoelectric conversion sections 11B and 11R are stacked in the vertical direction for each unit pixel P. The organic photoelectric conversion section 11G is provided on a rear surface (first surface 11S1) side of a semiconductor substrate 11. The inorganic photoelectric conversion sections 11B and 11R are embedded and formed in the semiconductor substrate 11, and stacked in the thickness direction of the semiconductor substrate 11. The organic photoelectric conversion section 11G includes the organic photoelectric conversion layer 16 including a p-type semiconductor and an n-type semiconductor and having a bulk hetero junction structure in a layer. The bulk hetero junction structure is a p/n junction surface formed by mixture of a p-type semiconductor and an n-type semiconductor.

The organic photoelectric conversion section 11G and the inorganic photoelectric conversion sections 11B and 11R perform photoelectric conversion by selectively detecting respective pieces of light of different wavelengths. Specifically, the organic photoelectric conversion section 11G acquires a green (G) color signal. The inorganic photoelectric conversion sections 11B and 11R respectively acquire a blue (B) color signal and a red (R) color signal by using a difference in absorption coefficients. This enables the photoelectric conversion element 10 to acquire a plurality types of color signals in one pixel without using a color filter.

It is to be noted that, in the present embodiment, description is given of a case of reading an electron as a signal charge (case where the n-type semiconductor region is used as a photoelectric conversion layer) of a pair of the electron and hole generated from photoelectric conversion. In addition, in the drawings, "+(plus)" assigned to "p" and "n" indicates that the concentration of p-type or n-type impurities is high, and "++" indicates that the concentration of p-type or n-type impurities is further higher than "+".

The semiconductor substrate 11 includes, for example, an n-type silicon (Si) substrate, and has a p-well 61 in a predetermined region. A second surface (front surface of the semiconductor substrate 11) 11S2 of the p-well 61 is provided with, for example, various floating diffusions (floating diffusion layers) FD (e.g., FD1, FD2, and FD3), various transistors Tr (e.g., vertical transistor (transfer transistor) Tr1, transfer transistor Tr2, amplifier transistor (modulation element) AMP, and reset transistor RST), and a multilayer wiring line 70. The multilayer wiring line 70 has a configuration in which wiring layers 71, 72, and 73, for example, are stacked in an insulating layer 74. In addition, a peripheral portion of the semiconductor substrate 11 is provided with a peripheral circuit (not illustrated) including a logic circuit or the like.

It is to be noted that FIG. 1 illustrates the first surface 11S1 side of the semiconductor substrate 11 as a light incident surface S1, and the second surface 11S2 side thereof as a wiring layer side S2.

The inorganic photoelectric conversion sections 11B and 11R each include, for example, a PIN (Positive Intrinsic Negative) type photodiode, and each have a p-n junction in a predetermined region of the semiconductor substrate 11. The inorganic photoelectric conversion sections 11B and 11R enable light to be dispersed in the vertical direction by using the wavelength bands of absorbed light that are different in accordance with the incidence depth on the silicon substrate.

The inorganic photoelectric conversion section 11B selectively detects the blue light to accumulate the signal charge corresponding to blue, and is installed at a depth that allows the blue light to be photoelectrically converted efficiently. The inorganic photoelectric conversion section 11R selectively detects the red light to accumulate the signal charge corresponding to red, and is installed at a depth that allows the red light to be photoelectrically converted efficiently. It is to be noted that blue (B) is a color corresponding to a wavelength band of 450 nm to 495 nm, for example, and red (R) is a color corresponding to a wavelength band of 620 nm to 750 nm, for example. It is sufficient if the inorganic photoelectric conversion sections 11B and 11R are able to detect pieces of light of a portion or all of the respective wavelength bands.

Specifically, as illustrated in FIG. 1, the inorganic photoelectric conversion section 11B and the inorganic photoelectric conversion section 11R each include, for example, a p+ region serving as a hole accumulation layer and an n region serving as an electron accumulation layer (they each have a p-n-p stacked structure). The n region of the inorganic photoelectric conversion section 11B is coupled to the vertical transistor Tr1. The p+ region of the inorganic photoelectric conversion section 11B bends along the vertical transistor Tr1, and links to the p+ region of the inorganic photoelectric conversion section 11R.

As described above, the second surface 11S2 of the semiconductor substrate 11 is provided with, for example, the floating diffusions (floating diffusion layers) FD1, FD2, and FD3, the vertical transistor (transfer transistor) Tr1, the transfer transistor Tr2, the amplifier transistor (modulation element) AMP, and the reset transistor RST.

The vertical transistor Tr is a transfer transistor that transfers, to the floating diffusion FD1, the signal charges (electrons, here) generated and accumulated in the inorganic photoelectric conversion section 11B. The signal charges correspond to blue. The inorganic photoelectric conversion section 11B is formed at a deep position from the second surface 11S2 of the semiconductor substrate 11, and thus it is preferable that the transfer transistor of the inorganic photoelectric conversion section 11B include the vertical transistor Tr1.

The transfer transistor Tr2 transfers, to the floating diffusion FD2, the signal charges (electrons, here) generated and accumulated in the inorganic photoelectric conversion section 11R. The signal charges correspond to red. The transfer transistor Tr2 includes, for example, a MOS transistor.

The amplifier transistor AMP is a modulation element that modulates, into a voltage, an amount of the charges generated in the organic photoelectric conversion section 11G, and includes, for example, a MOS transistor.

The reset transistor RST resets the charges transferred from the organic photoelectric conversion section 11G to the floating diffusion FD3, and includes, for example, a MOS transistor.

A lower first contact 75, a lower second contact 76, and an upper contact 13B each include, for example, a doped silicon material such as PDAS (Phosphorus Doped Amorphous Silicon), or a metallic material such as aluminum (Al), tungsten (W), titanium (Ti), cobalt (Co), hafnium (Hf), or tantalum (Ta).

The organic photoelectric conversion section 11G is provided on the first surface 11S1 side of the semiconductor substrate 11. The organic photoelectric conversion section 11G has a configuration in which, for example, a lower electrode 15, the organic photoelectric conversion layer 16, and an upper electrode 17 are stacked in this order from the side of the first surface 11S1 of the semiconductor substrate 11. The lower electrode 15 is, for example, separately formed for each photoelectric conversion element 10. The organic photoelectric conversion layer 16 and the upper electrode 17 are provided as successive layers common to the plurality of photoelectric conversion elements 10. The organic photoelectric conversion section 11G is an organic photoelectric conversion element that absorbs the green light corresponding to a portion or all of selective wavelength bands (e.g., 450 nm or more and 650 nm or less) to generate an electron-hole pair.

Between the first surface 11S1 of the semiconductor substrate 11 and the lower electrode 15, for example, inter-layer insulating layers 12 and 14 are stacked in this order from the semiconductor substrate 11 side. The inter-layer insulating layers each have a configuration in which, for example, a layer (fixed charge layer) 12A having a fixed charge and a dielectric layer 12B having insulation properties are stacked. A protective layer 18 is provided on the upper electrode 17. An on-chip lens layer 19 included in an on-chip lens 19L and also serving as a planarization layer is disposed above the protective layer 18.

A through-electrode 63 is provided between the first surface 11S1 and the second surface 11S2 of the semiconductor substrate 11. The organic photoelectric conversion section 11G is coupled to a gate Gamp of the amplifier transistor AMP and the floating diffusion FD3 via this through-electrode 63. This enables the photoelectric conversion element 10 to transfer charges generated in the organic photoelectric conversion section 11G on the first surface 11S1 side of the semiconductor substrate 11 to the second surface 11S2 side of the semiconductor substrate 11 via the through-electrode 63 in a favorable manner, thus making it possible to improve characteristics.

The through-electrode 63 is provided, for example, for each organic photoelectric conversion section 11G of the photoelectric conversion element 10. The through-electrode 63 has a function of a connector for the organic photoelectric conversion section 11G and the gate Gamp of the amplifier transistor AMP, and the floating diffusion FD3, and serves as a transmission path for the charges generated in the organic photoelectric conversion section 11G.

The lower end of the through-electrode 63 is coupled to a coupled portion 71A in the wiring layer 71, for example, and the coupled portion 71A and the gate Gamp of the amplifier transistor AMP are coupled via the lower first contact 75. The coupled portion 71 and the floating diffusion FD3 are coupled to the lower electrode 15 via the lower second contact 76. It is to be noted that FIG. 1 illustrates the through-electrode 63 in the shape of a cylinder, but this is not limitative. The through-electrode 63 may have a tapered shape, for example.

As illustrated in FIG. 1, a reset gate Grst of the reset transistor RST is preferably disposed next to the floating diffusion FD3. This makes it possible to cause the reset transistor RST to reset the charges accumulated in the floating diffusion FD3.

In the photoelectric conversion element 10 according to the present embodiment, light inputted to the organic photoelectric conversion section 11G from the upper electrode 17 side is absorbed by the organic photoelectric conversion layer 16. Excitons thus generated move to an interface between an electron donor and an electron acceptor included in the organic photoelectric conversion layer 16, and undergo exciton separation, that is, dissociate into electrons and holes. The charges (electrons and holes) generated here are transported to different electrodes by diffusion due to a difference in carrier concentration or by an internal electric field due to a difference in work functions between an anode (here, the upper electrode 17) and a cathode (here, the lower electrode 15), and are detected as a photocurrent. In addition, the application of an electric potential between the lower electrode 15 and the upper electrode 17 makes it possible to control directions in which electrons and holes are transported.

The following describes configurations, materials, or the like of respective sections.

The organic photoelectric conversion section 11G is an organic photoelectric conversion element that absorbs the green light corresponding to a portion or all of selective wavelength bands (e.g., 450 nm or more and 650 nm or less) to generate an electron-hole pair.

The lower electrode 15 is provided in a region that directly faces light-receiving surfaces of the inorganic photoelectric conversion sections 11B and 11R formed in the semiconductor substrate 11 and covers these light-receiving surfaces. The lower electrode 15 includes an electrically-conducive layer having light-transmissivity, and includes, for example, ITO (indium-tin oxide). However, as a material included in the lower electrode 15, a tin oxide ($SnO_2$)-based material obtained by adding a dopant or a zinc oxide-based material formed by adding a dopant to zinc oxide (ZnO) may be used in addition to this ITO. Examples of the zinc oxide-based materials include aluminum zinc oxide (AZO) obtained by adding aluminum (Al) as the dopant, gallium (Ga)-added gallium zinc oxide (GZO), and indium (In)-added indium zinc oxide (IZO). In addition to these, CuI, $InSbO_4$, $ZnMgO$, $CuInO_2$, $MgIN_2O_4$, CdO, $ZnSnO_3$, or the like may also be used.

The organic photoelectric conversion layer 16 converts optical energy into electric energy. The organic photoelectric conversion layer 16 includes, for example, two or more types of organic semiconductor materials, and preferably includes, for example, one or both of a p-type semiconductor and an n-type semiconductor. For example, in a case where the organic photoelectric conversion layer 16 includes the two types of organic semiconductor materials including a p-type semiconductor and an n-type semiconductor, for example, one of the p-type semiconductor and the n-type semiconductor is preferably a material having transmissivity to visible light, and the other thereof is preferably a material that photoelectrically converts light in a selective wavelength region (e.g., 450 nm or more and 650 nm or less). Alternatively, the organic photoelectric conversion layer 16 preferably includes three types of organic semiconductor materials including a material (light absorber), an n-type semiconductor, and a p-type semiconductor. The material (light absorber) photoelectrically converts light in a selective wavelength region. The n-type semiconductor and the p-type semiconductor each have light-transmissivity to visible light. The organic photoelectric conversion layer 16 has a bulk heterostructure in which the plurality of these organic semiconductor materials is randomly mixed in the layer.

Figure 2:
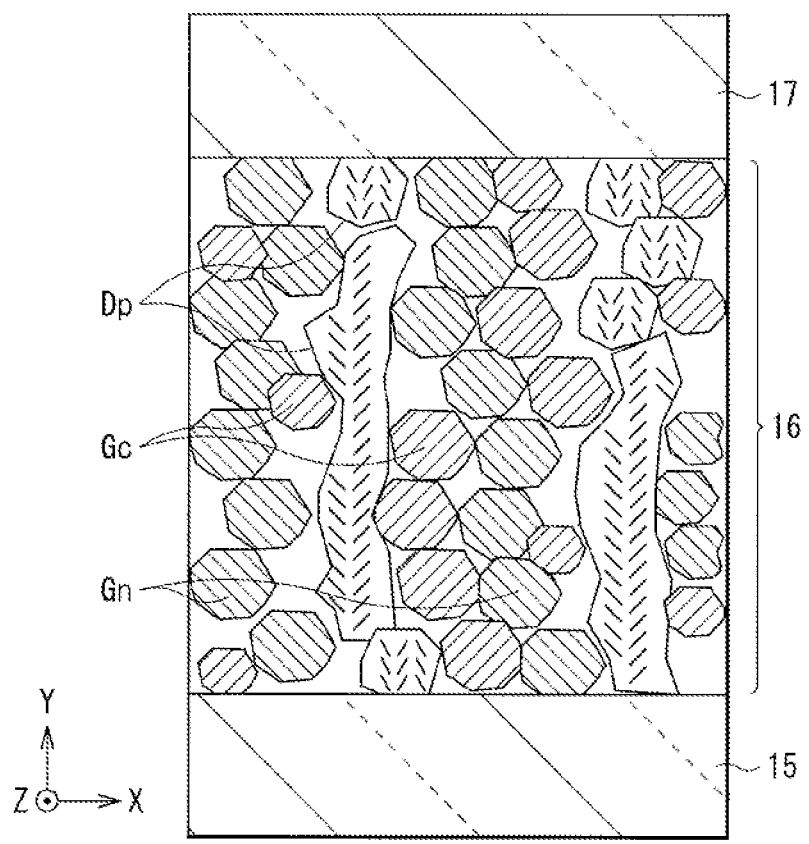
FIG. 2 is a schematic diagram illustrating an example of a mixture state of respective organic semiconductor materials in an organic photoelectric conversion layer illustrated in FIG. 1.

FIG. 2 schematically illustrates an example of a mixture state of the respective organic semiconductor materials in the organic photoelectric conversion layer 16 according to the present embodiment. In the organic photoelectric conversion layer 16, as illustrated in FIG. 2, for example, the above-described three types of organic semiconductor materials (light absorber, p-type semiconductor, and n-type semiconductor) are randomly mixed. In the organic photoelectric conversion layer 16, the respective organic semiconductor materials form grains (e.g., a grain Gc of the light absorber and a grain Gn of the n-type semiconductor). In the present embodiment, there is a domain (e.g., domain Dp) of at least one (e.g., p-type semiconductor (one organic semiconductor material)) of a plurality of types of organic semiconductor materials in the layer. It is to be noted that the domain is, for example, a region including a continuous arrangement of one organic semiconductor material. In addition, in the organic photoelectric conversion layer 16, a domain (e.g., n-type semiconductor or light absorber) may be formed in addition to the domain of a p-type semiconductor. In addition, a domain may include two or more types of organic semiconductor materials.

The domain Dp of the p-type semiconductor according to the present embodiment preferably has a percolation structure in which the domain Dp vertically extends in the organic photoelectric conversion layer 16 in the film-thickness direction (Y-axis direction). Further, the domain Dp of the p-type semiconductor preferably has a shape in which the length (domain length) of the domain in the plane direction (e.g., X-axis direction) is smaller than the domain length in the film-thickness direction. That is, the p-type semiconductor preferably forms the domain Dp extending in the p film-thickness direction of the organic photoelectric conversion layer 16.

Figure 3:
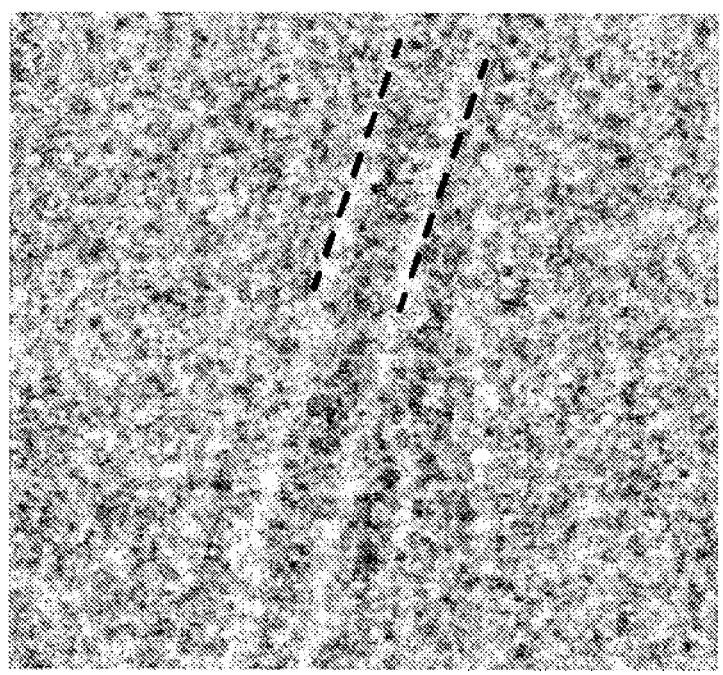
FIG. 3 is a TEM image for describing an interference fringe.

FIG. 3 is an enlarged view of a portion of an image (TEM image) obtained by photographing the organic photoelectric conversion layer 16 (Experiment Example 1 described below) by a transmission electron microscope under a defocus condition. The organic photoelectric conversion layer 16 is fabricated by using a p-type semiconductor that forms the domain as described above. In the organic photoelectric conversion layer 16 according to the present embodiment, an interference fringe including two or more lines as illustrated by dotted lines in FIG. 3 is confirmed in the region corresponding to the domain Dp. An interference fringe preferably includes less than ten lines.

This interference fringe is observed because the period of p-type semiconductor molecules forming a domain in the major axis direction and electronic waves cause phase contrast. That is, paired lines that are adjacent to each other among the two or more lines included in the interference fringe each correspond to the molecular period of p-type semiconductor molecules in the major axis direction. The interference fringe extends in the organic photoelectric conversion layer 16 substantially in the film-thickness direction, and preferably has a length of 20 nm or more. In addition, as the extending direction of the interference fringe, specifically, the angle formed between the interference fringe and the electrode surface of the lower electrode 15 is preferably more than 450 and 900 or less. The interval between these two lines preferably falls within ±50% of the molecular length of the p-type semiconductor, for example. More preferably, the interval between these two lines falls within +30%. That is, p-type semiconductors are periodically stacked in the same direction between the two lines included in the interference fringe. It is to be noted that the molecular length of a p-type semiconductor is the length of the molecules of the p-type semiconductor in the major axis direction.

As described above, the organic photoelectric conversion layer 16 preferably includes two types of organic semiconductor materials including an n-type semiconductor and a p-type semiconductor or three types of organic semiconductor materials including a light absorber, an n-type semiconductor, and a p-type semiconductor. There is a junction surface (p/n junction surface) between the p-type semiconductor and the n-type semiconductor in the layer. The light absorber has the maximal absorption wavelength within a range of, for example, 450 nm or more and 650 nm or less. The p-type semiconductor relatively functions as an electron donor (donor), and the use of a material having a hole transporting property is preferable, for example. The n-type semiconductor relatively functions as an electron acceptor (acceptor), and the use of a material having an electron transporting property is preferable, for example. The organic photoelectric conversion layer 16 provides a field in which excitons generated at the time of light absorption are separated into electrons and holes, and specifically, excitons are separated into electrons and holes on the interface (p/n junction surface) between the electron donor and the electron acceptor. The thickness of the organic photoelectric conversion layer 16 is, for example, 50 nm to 500 nm. The interface between the organic photoelectric conversion layer 16 and the upper electrode 17 preferably has a surface roughness of 10 nm or less.

It is to be noted that an example in which a p-type semiconductor forms the domain Dp has been described in the present embodiment, but this is not limitative. For example, an n-type semiconductors may form a domain.

The upper electrode 17 includes an electrically-conductive film having light-transmissivity similar to that of the lower electrode 15. In the solid-state imaging device 1 including the photoelectric conversion element 10 as one pixel, this upper electrode 17 may be separated for each pixel, or may be formed as an electrode common to each pixel. The thickness of the upper electrode 17 is, for example, 10 nm to 200 nm.

It is to be noted that other layers may be provided between the organic photoelectric conversion layer 16 and the lower electrode 15 and between the organic photoelectric conversion layer 16 and the upper electrode 17. Specifically, for example, an underlying film, a hole transport layer, an electron blocking film, the organic photoelectric conversion layer 16, a hole blocking film, a buffer film, an electron transport layer, a work function adjusting film, and the like may be stacked in order from the lower electrode 15 side.

The fixed charge layer 12A may be a film having a positive fixed charge or a film having a negative fixed charge. As materials of the film having the negative fixed charge, hafnium oxide, aluminum oxide, zirconium oxide, tantalum oxide, titanium oxide, and the like are included. In addition, as a material other than the above-described materials, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, an aluminum nitride film, a hafnium oxynitride film, an aluminum oxynitride film, or the like may be used.

The fixed charge layer 12A may also have a configuration in which two or more types of films are stacked. This makes it possible to further improve a function of a hole accumulation layer in a case of a film having the negative fixed charge, for example.

Although materials of the dielectric layer 12B are not limited in particular, the dielectric layer 12B includes a silicon oxide film, TEOS, a silicon nitride film, a silicon oxynitride film, or the like, for example.

The inter-layer insulating layer 14 includes, for example, a single-layer film including one type of silicon oxide, silicon nitride, silicon oxynitride (SiON), and the like, or a stacked film including two or more types thereof.

The protective layer 18 includes a material having light-transmissivity, and includes, for example, a single layer film including any of silicon oxide, silicon nitride, silicon oxynitride, and the like, or a stacked film including two or more types thereof. The thickness of the protective layer 18 is, for example, 100 nm to 30000 nm.

The on-chip lens layer 19 is formed on the protective layer 18 to cover the entire surface thereof. The plurality of on-chip lenses (microlenses) 19L is provided on the front surface of the on-chip lens layer 19. The on-chip lenses 19L each condense light inputted from above the on-chip lens 19L on the respective light-receiving surfaces of the organic photoelectric conversion section 11G and the inorganic photoelectric conversion sections 11B and 11R. In the present embodiment, the multilayer wiring line 70 is formed on the second surface 11S2 side of the semiconductor substrate 11. This enables the respective light-receiving surfaces of the organic photoelectric conversion section 11G and the inorganic photoelectric conversion sections 11B and 11R to be disposed close to each other, thus making it possible to reduce sensitivity variations between the respective colors generated depending on an F-value of the on-chip lens 19L.

Figure 4:
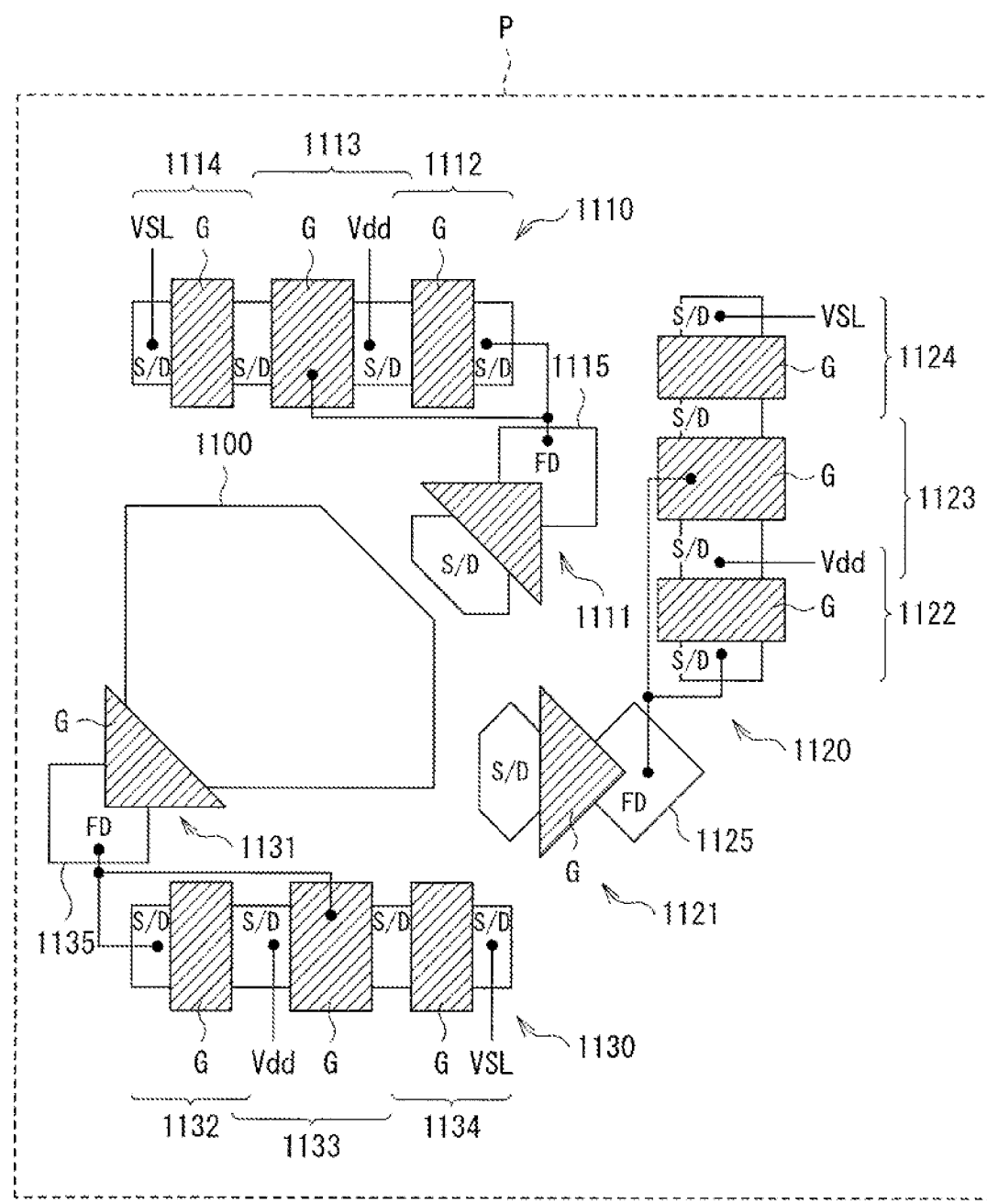
FIG. 4 is a schematic plan view of a configuration of a unit pixel of the photoelectric conversion element illustrated in FIG. 1.

FIG. 4 is a plan view of an configuration example of a photoelectric conversion element including a pixel in which a plurality of photoelectric conversion sections (e.g., the above-described inorganic photoelectric conversion sections 11B and 11R, and organic photoelectric conversion section 11G) to which the technology according to the present disclosure is applicable are stacked. That is, FIG. 4 illustrates an example of a planar configuration of the unit pixel P included in a pixel section 1a illustrated in FIG. 8, for example.

The unit pixel P includes a photoelectric conversion region 1100 in which a red photoelectric conversion section (inorganic photoelectric conversion section 11R in FIG. 1), a blue photoelectric conversion section (inorganic photoelectric conversion section 11B in FIG. 3), and a green photoelectric conversion section (organic photoelectric conversion section 11G in FIG. 1) (neither of which is illustrated in FIG. 4) that photoelectrically convert respective pieces of light of the wavelengths of R (Red), G (Green), and B (Blue)

are stacked in three layers in the order of the green photoelectric conversion section, the blue photoelectric conversion section, and the red photoelectric conversion section, for example, from the light-receiving surface (light incident surface S1 in FIG. 1) side. Further, the unit pixel P includes a Tr group 1110, a Tr group 1120, and a Tr group 1130 as charge readout sections that read charges corresponding to the respective pieces of light of wavelengths of R, G, and B from the red photoelectric conversion section, the green photoelectric conversion section, and the blue photoelectric conversion section. The solid-state imaging device 1 disperses light in the vertical direction in one unit pixel P, that is, disperses the respective pieces of light of R, G, and B in the respective layers serving as the red photoelectric conversion section, the green photoelectric conversion section, and the blue photoelectric conversion section stacked in the photoelectric conversion region 1100.

The Tr group 1110, the Tr group 1120, and the Tr group 1130 are formed on the periphery of the photoelectric conversion region 1100. The Tr group 1110 outputs, as a pixel signal, a signal charge corresponding to the light of R generated and accumulated in the red photoelectric conversion section. The Tr group 1110 includes a transfer Tr (MOS FET) 1111, a reset Tr 1112, an amplification Tr 1113, and a selection Tr 1114. The Tr group 1120 outputs, as a pixel signal, a signal charge corresponding to the light of B generated and accumulated in the blue photoelectric conversion section. The Tr group 1120 includes a transfer Tr 1121, a reset Tr 1122, an amplification Tr 1123, and a selection Tr 1124. The Tr group 1130 outputs, as a pixel signal, a signal charge corresponding to the light of G generated and accumulated in the green photoelectric conversion section. The Tr group 1130 includes a transfer Tr 1131, a reset Tr 1132, an amplification Tr 1133, and a selection Tr 1134.

The transfer Tr 1111 includes (source/drain region serving as) a gate G, a source/drain region S/D, and FD (floating diffusion) 1115. The transfer Tr 1121 includes a gate G, a source/drain region S/D, and FD 1125. The transfer Tr 1131 includes a gate G, (source/drain region S/D coupled to) the green photoelectric conversion section of the photoelectric conversion region 1100, and FD 1135. It is to be noted that the source/drain region of the transfer Tr 1111 is coupled to the red photoelectric conversion section of the photoelectric conversion region 1100, and the source/drain region S/D of the transfer Tr 1121 is coupled to the blue photoelectric conversion section of the photoelectric conversion region 1100.

The reset Trs 1112, 1132, and 1122, the amplification Trs 1113, 1133, and 1123, and the selection Trs 1114, 1134, and 1124 each include a gate G and a pair of source/drain regions S/D disposed across the gate G.

The FDs 1115, 1135, and 1125 are coupled to the respective source/drain regions S/D serving as sources of the reset Trs 1112, 1132, and 1122, and are coupled to the respective gates G of the amplification Trs 1113, 1133 and 1123. A power supply Vdd is coupled to the common source/drain region S/D in each of the reset Tr 1112 and the amplification Tr 1113, the reset Tr 1132 and the amplification Tr 1133, and the reset Tr 1122 and the amplification Tr 1123. VSL (vertical signal line) is coupled to each of the source/drain regions S/D serving as the respective sources of the selection Trs 1114, 1134, and 1124.

The technology according to the present disclosure is applicable to the photoelectric conversion element as described above.

(1-2. Method of Manufacturing Photoelectric Conversion Element)

It is possible to manufacture the photoelectric conversion element 10 according to the present embodiment, for example, in the following manner.

Figure 5:
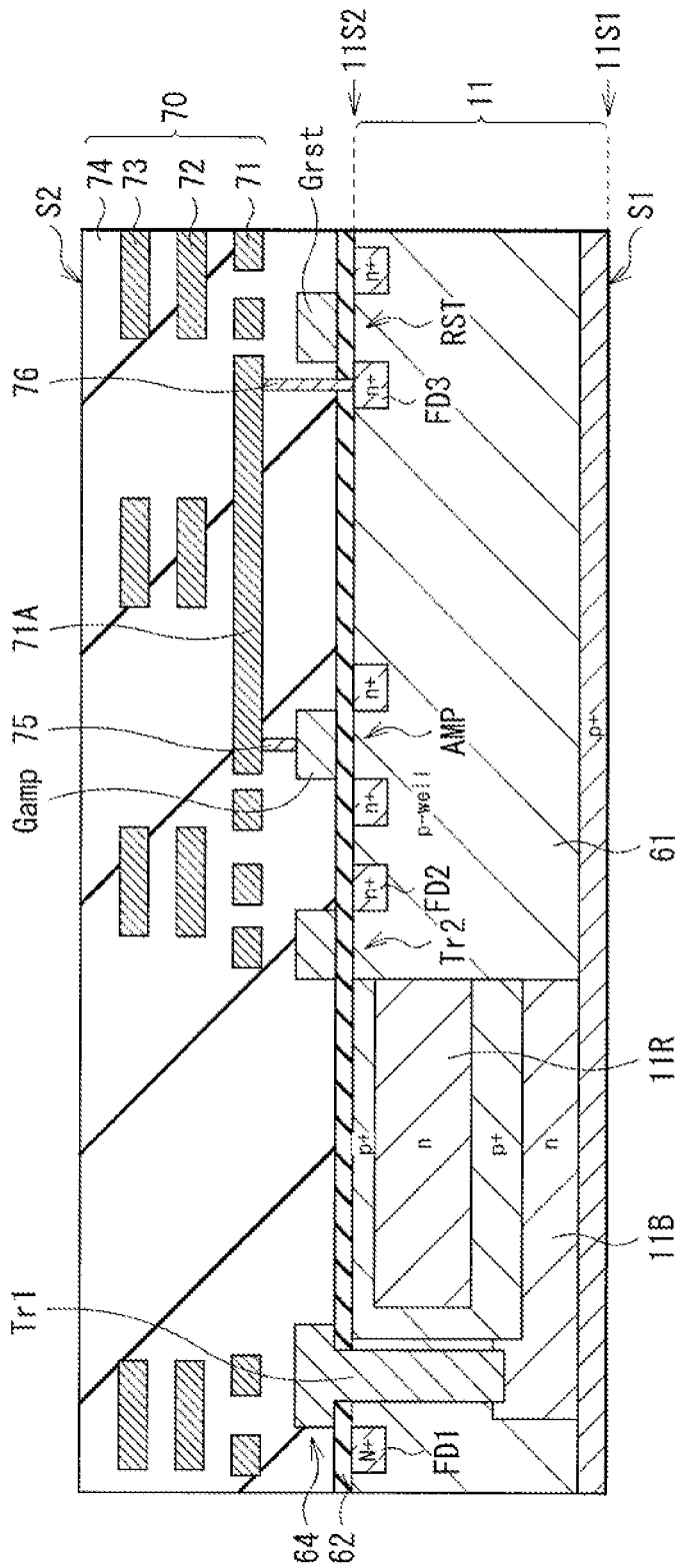
FIG. 5 is a schematic cross-sectional view for describing a method of manufacturing the photoelectric conversion element illustrated in FIG. 1.
Figure 6:
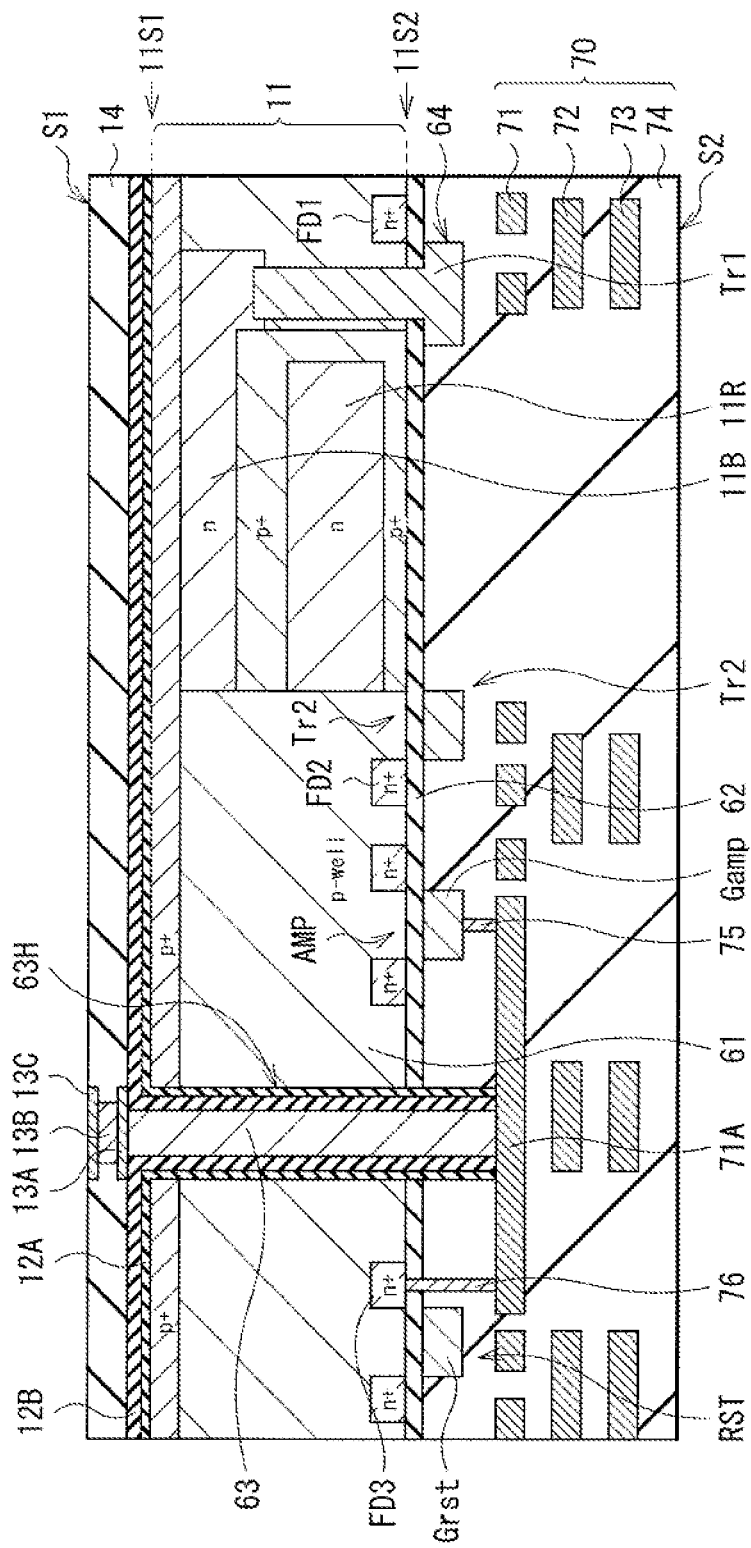
FIG. 6 is a schematic cross-sectional view illustrating a process following FIG. 5.

FIGS. 5 and 6 each illustrate a method of manufacturing the photoelectric conversion element 10 in order of processes. First, as illustrated in FIG. 5, the p-well 61, for example, is formed as a first electrically-conductive well in the semiconductor substrate 11. The second electrically-conductive (e.g., n-type) inorganic photoelectric conversion sections 11B and 11R are formed in this p-well 61. A p+ region is formed in the vicinity of the first surface 11S1 of the semiconductor substrate 11.

As also illustrated in FIG. 5, on the second surface 11S2 of the semiconductor substrate 11, after n+ regions serving as the floating diffusions FD1 to FD3 are formed, a gate insulating layer 62 and a gate wiring layer 64 including the respective gates of the vertical transistor Tr1, the transfer transistor Tr2, the amplifier transistor AMP, and the reset transistor RST are formed. This forms the vertical transistor Tr1, the transfer transistor Tr2, the amplifier transistor AMP, and the reset transistor RST. Further, the multilayer wiring line 70 is formed on the second surface 11S2 of the semiconductor substrate 11. The multilayer wiring line 70 includes wiring layers 71 to 73 and the insulating layer 74. The wiring layers 71 to 73 include the lower first contact 75, the lower second contact 76, and the coupled portion 71A.

As a base of the semiconductor substrate 11, for example, an SOI (Silicon on Insulator) substrate is used in which the semiconductor substrate 11, an embedded oxide film (not illustrated), and a holding substrate (not illustrated) are stacked. Although not illustrated in FIG. 5, the embedded oxide film and the holding substrate are joined to the first substrate surface 11S1 of the semiconductor substrate 11. After ion implantation, an annealing process is performed.

Then, a support substrate (not illustrated), another semiconductor substrate, or the like is joined to the second surface 11S2 side (multilayer wiring line 70 side) of the semiconductor substrate 11 and flipped vertically. Subsequently, the semiconductor substrate 11 is separated from the embedded oxide film and the holding substrate of the SOI substrate to expose the first surface 11S1 of the semiconductor substrate 11. It is possible to perform these processes with technology used in a normal CMOS process such as ion implantation and CVD (Chemical Vapor Deposition).

Then, as illustrated in FIG. 6, the semiconductor substrate 11 is processed from the first surface 11S1 side with dry etching, for example, to form an annular opening 63H. The opening 63H has a depth penetrating from the first surface 11S1 to the second surface 11S2 of the semiconductor substrate 11 as illustrated in FIG. 6, and reaching the coupled portion 71A, for example.

Subsequently, as illustrated in FIG. 6, for example, the negative fixed charge layer 12A is formed on the first surface 11S1 of the semiconductor substrate 11 and a side face of the opening 63H. Two or more types of films may be stacked as the negative fixed charge layer 12A. This makes it possible to further improve the function of the hole accumulation layer. The dielectric layer 12B is formed after the negative fixed charge layer 12A is formed.

Next, an electric conductor is embedded in the opening 63H to form the through-electrode 63. As the electric conductor, for example, a metallic material such as aluminum (Al), tungsten (W), titanium (Ti), cobalt (Co), hafnium (Hf), and tantalum (Ta) is usable in addition to a doped silicon material such as PDAS (Phosphorus Doped Amorphous Silicon).

Subsequently, after a pad section 13A is formed on the through-electrode 63, the interlayer insulating layer 14 is formed on the dielectric layer 12B and the pad section 13. In the interlayer insulating layer 14, the upper contact 13B and a pad section 13C are provided on the pad section 13A. The upper contact 13B and the pad section 13C electrically couple the lower electrode 15 and the through-electrode 63 (specifically, the pad section 13A on the through-electrode 63).

Next, the lower electrode 15, the organic photoelectric conversion layer 16, the upper electrode 17, and the protective layer 18 are formed in this order on the interlayer insulating layer 14. As the organic photoelectric conversion layer 16, for example, films of the above-described three types of organic semiconductor materials are formed by using, for example, a vacuum deposition method. Finally, the on-chip lens layer 19 is disposed that includes the plurality of on-chip lenses 19L on the surface thereof. Thus, the photoelectric conversion element 10 illustrated in FIG. 1 is completed.

It is to be noted that, in a case where another organic layer (e.g., electron-blocking layer, etc.) is formed on or under the organic photoelectric conversion layer 16 as described above, it is desirable to continuously form the other organic layer (by a vacuum-consistent process) in a vacuum process. In addition, the method of forming the organic photoelectric conversion layer 16 is not necessarily limited to the method using a vacuum deposition method, but another method, for example, a spin-coating technique, a printing technique, or the like may be used.

When light enters the organic photoelectric conversion section 11G via the on-chip lens 19L in the photoelectric conversion element 10, the light passes through the organic photoelectric conversion section 11G, the inorganic photoelectric conversion sections 11B and the 11R in this order, and the respective pieces of light of green, blue, and red are photoelectrically converted in the passing process. The following describes an operation of acquiring signals of the respective colors.

(Acquisition of Green Color Signal by Organic Photoelectric Conversion Section 11G)

First, the green light of the pieces of light inputted into the photoelectric conversion element 10 is selectively detected (absorbed) and photoelectrically converted by the organic photoelectric conversion section 11G.

The organic photoelectric conversion section 11G is coupled to a gate Gamp of the amplifier transistor AMP and the floating diffusion FD3 via the through-electrode 63. Thus, the electron of the electron-hole pair generated in the organic photoelectric conversion section 11G is taken out from the lower electrode 15 side, transferred to the second surface 11S2 side of the semiconductor substrate 11 via the through-electrode 63, and accumulated in the floating diffusion FD3. At the same time as this, the amplifier transistor AMP modulates the amount of the charges generated in the organic photoelectric conversion section 11G into a voltage.

In addition, the reset gate Grst of the reset transistor RST is disposed next to the floating diffusion FD3. This causes the reset transistor RST to reset the charges accumulated in the floating diffusion FD3.

Here, the organic photoelectric conversion section 11G is coupled to not only the amplifier transistor AMP, but also the floating diffusion FD3 via the through-electrode 63, making it possible for the reset transistor RST to easily reset the charges accumulated in the floating diffusion FD3.

In contrast, in a case where the through-electrode 63 and the floating diffusion FD3 are not coupled, it is difficult to reset the charges accumulated in the floating diffusion FD3, resulting in application of a large voltage to pull out the charges to the upper electrode 17 side. Accordingly, there is a possibility that the organic photoelectric conversion layer 16 is damaged. In addition, a structure that enables resetting in a short period of time leads to increased dark-time noise and results in a trade-off. This structure is thus difficult.

(Acquisition of Blue Color Signal and Red Color Signal by Inorganic Photoelectric Conversion Sections 11B and 11R)

Subsequently, the blue light and the red light of the pieces of light passing through the organic photoelectric conversion section 11G are respectively absorbed in sequence and photoelectrically converted in the inorganic photoelectric conversion section 11B and the inorganic photoelectric conversion section 11R. In the inorganic photoelectric conversion section 11B, electrons corresponding to the inputted blue light are accumulated in the n-region of the inorganic photoelectric conversion section 11, and the accumulated electrons are transferred to the floating diffusion FD1 by the vertical transistor Tr1. Similarly, in the inorganic photoelectric conversion section 11R, electrons corresponding to the inputted red light are accumulated in the n-region of the inorganic photoelectric conversion section 11R, and the accumulated electrons are transferred to the floating diffusion FD2 by the transfer transistor Tr2.

(1-3. Workings and Effects)

As described above, an organic photoelectric conversion element used for an organic thin-film solar cell, an organic imaging element, or the like adopts a bulk heterostructure in which a p-type organic semiconductor and an n-type organic semiconductor are mixed. However, organic semiconductors have low conductive characteristics, and the organic photoelectric conversion element is thus unable to obtain sufficient quantum efficiency. Therefore, there is a problem that an electric output signal is easily delayed with respect to the incident light.

In general, it is found that molecular orientation is important for conduction of organic semiconductors. The same applies to an organic photoelectric conversion element having a bulk heterostructure. It is known that, in an organic photoelectric conversion element in which a conduction direction is perpendicular to a substrate, it is generally preferable that the organic semiconductor be oriented parallel with the substrate. Therefore, as described above, various measures are taken to improve the horizontal orientation of an organic semiconductor included in an organic photoelectric conversion layer.

However, simply orienting the organic molecules parallel with the substrate does not sufficiently increase the conductive characteristic of the organic photoelectric conversion element, failing in sufficient improvement in the quantum efficiency and responsiveness in some cases. In a photoelectric conversion element having a bulk heterostructure, each material included in the bulk heterostructure in the layer is requested to form an appropriate grain. For example, in a case where a large defect is present on the grain boundary, the conductive characteristic is greatly degraded. One reason for this is that charge is trapped at a trap level of the defect or the defect serves as an energy barrier to inhibit charge transfer between grains when the charge conducts on the grain boundary. This is considered to lead to deterioration in quantum efficiency and response speed.

In contrast, in the present embodiment, the organic photoelectric conversion layer 16 includes an organic semiconductor material (one organic semiconductor material) that forms a domain (e.g., domain Dp) having a predetermined shape in the layer. Specifically, the organic photoelectric conversion layer 16 is formed that includes an organic semiconductor material which forms a domain having a percolation structure and having a shape in which the length of the domain in the plane direction is smaller than the length of the domain in the film-thickness direction. In the percolation structure, the domain vertically extends in the organic photoelectric conversion layer 16 in the film-thickness direction. This makes it possible to appropriately control a mixture state of organic semiconductor materials in the organic photoelectric conversion layer.

As described above, the photoelectric conversion element 10 according to the present embodiment includes one organic semiconductor material (e.g., p-type semiconductor) in the organic photoelectric conversion layer 16. The one organic semiconductor material (e.g., p-type semiconductor) forms the domain as described above in the organic photoelectric conversion layer 16. This causes organic semiconductor materials (e.g., an n-type semiconductor and a light absorber in addition to the above-described p-type semiconductor) included in the organic photoelectric conversion layer 16 to be controlled in an appropriate mixture state. This makes it possible to increase the external quantum efficiency and response speed.

Next, a modification example of the present disclosure is described. It is to be noted that components corresponding to those of the photoelectric conversion element 10 according to the above-described embodiment are denoted by the same reference numerals, and description thereof is omitted.

2. Modification Example

Figure 7:
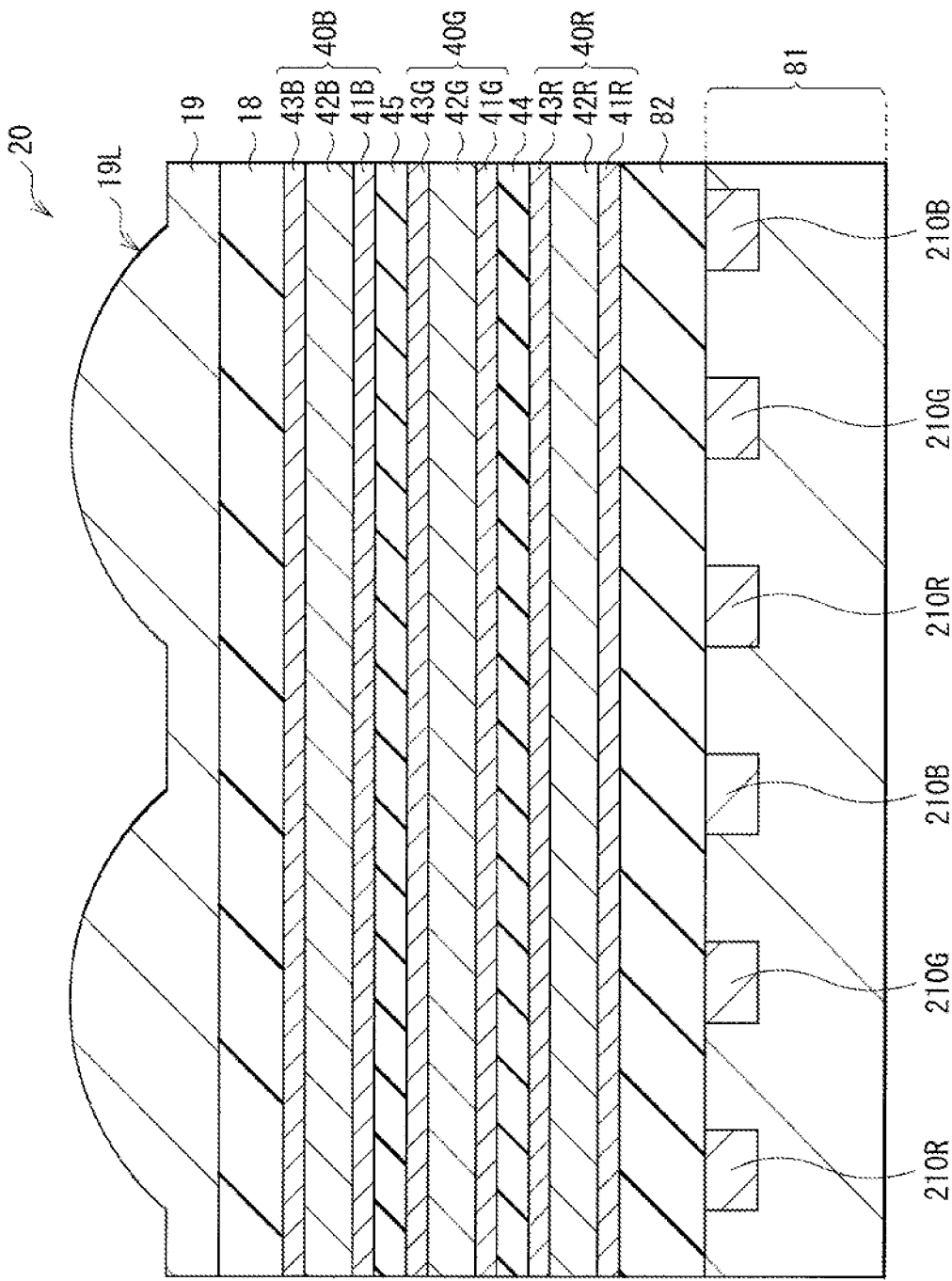
FIG. 7 is a schematic cross-sectional view of a configuration of a photoelectric conversion element according to a modification example of the present disclosure.

FIG. 7 illustrates a cross-sectional configuration of a photoelectric conversion element (photoelectric conversion element 20) according to a modification example of the present disclosure. The photoelectric conversion element 20 is included, for example, in one unit pixel P in the solid-state imaging element (solid-state imaging device 1) such as a backside illumination type CCD image sensor or CMOS image sensor, similarly to the photoelectric conversion element 10 according to the above-described embodiment, etc. The photoelectric conversion element 20 according to the present modification example has a configuration in which a red photoelectric conversion section 40R, a green photoelectric conversion section 40G, and a blue photoelectric conversion section 40B are stacked in this order on a silicon substrate 81 with the insulating layer 82 interposed therebetween.

The red photoelectric conversion section 40R, the green photoelectric conversion section 40G, and the blue photoelectric conversion section 40B respectively include organic photoelectric conversion layers 42R, 42G, and 42B between the respective pairs of electrodes. Specifically, the red photoelectric conversion section 40R, the green photoelectric conversion section 40G, and the blue photoelectric conversion section 40B respectively include the organic photoelectric conversion layers 42R, 42G, and 42B between a first electrode 41R and a second electrode 43R, between a first electrode 41G and a second electrode 43G, and between a first electrode 41B and a second electrode 43B. The organic photoelectric conversion layers 42R, 42G, and 42B each include a ChDT derivative, making it possible to obtain effects similar to those of the above-described embodiment.

As described above, the photoelectric conversion element 20 has a configuration in which the red photoelectric conversion section 40R, the green photoelectric conversion section 40G, and the blue photoelectric conversion section 40B are stacked in this order on the silicon substrate 81 with the insulating layer 82 interposed therebetween. The on-chip lens 19L is provided on the blue photoelectric conversion section 40B with the protective layer 18 and the on-chip lens layer 19 interposed therebetween. A red electricity storage layer 210R, a green electricity storage layer 210G, and a blue electricity storage layer 210B are provided in the silicon substrate 81. The pieces of light inputted into the on-chip lens 19L are photoelectrically converted by the red photoelectric conversion section 40R, the green photoelectric conversion section 40G, and the blue photoelectric conversion section 40B. The respective signal charges are transmitted from the red photoelectric conversion section 40R to the red electricity storage layer 210R, from the green photoelectric conversion section 40G to the green electricity storage layer 210G, and from the blue photoelectric conversion section 40B to the blue electricity storage layer 210B. Although the signal charges may be either electrons or holes generated by photoelectric conversion, the following gives description by exemplifying a case where electrons are read as signal charges.

The silicon substrate 81 includes, for example, a p-type silicon substrate. The red electricity storage layer 210R, the green electricity storage layer 210G, and the blue electricity storage layer 210B provided in this silicon substrate 81 each include an n-type semiconductor region. The respective signal charges (electrons) supplied from the red photoelectric conversion section 40R, the green photoelectric conversion section 40G, and the blue photoelectric conversion section 40B are accumulated in the n-type semiconductor regions. The n-type semiconductor regions of the red electricity storage layer 210R, the green electricity storage layer 210G, and the blue electricity storage layer 210B are formed, for example, by doping the silicon substrate 81 with n-type impurities such as phosphorus (P) or arsenic (As). It is to be noted that the silicon substrate 81 may be provided on a support substrate (not illustrated) of glass, or the like.

The silicon substrate 81 includes a pixel transistor for reading the respective electrons from the red electricity storage layer 210R, the green electricity storage layer 210G, and the blue electricity storage layer 210B and transferring the read electrons to, for example, a vertical signal line (vertical signal line Lsig in FIG. 8 described below). A floating diffusion of this pixel transistor is provided in the silicon substrate 81, and this floating diffusion is coupled to the red electricity storage layer 210R, the green electricity storage layer 210G, and the blue electricity storage layer 210B. The floating diffusion includes an n-type semiconductor region.

The insulating layer 82 includes, for example, silicon oxide, silicon nitride, silicon oxynitride, hafnium oxide, or the like. The insulating layer 82 may include a plurality of types of insulating films that is stacked. The insulating layer 82 may include an organic insulating material. This insulating layer 82 includes respective plugs and respective electrodes for coupling the red electricity storage layer 210R and the red photoelectric conversion section 40R, the green electricity storage layer 210G and the green photoelectric conversion section 40G, and the blue electricity storage layer 210B and the blue photoelectric conversion section 40B.

The red photoelectric conversion section 40R includes the first electrode 41R, an organic photoelectric conversion layer 42R, and the second electrode 43R in this order from a position close to the silicon substrate 81. The green photoelectric conversion section 40G includes the first electrode 41G, an organic photoelectric conversion layer 42G, and the second electrode 43G in this order from a position close to the red photoelectric conversion section 40R. The blue photoelectric conversion section 40B includes the first electrode 41B, an organic photoelectric conversion layer 42B, and the second electrode 43B in this order from a position close to the green photoelectric conversion section 40G. An insulating layer 44 is provided between the red photoelectric conversion section 40R and the green photoelectric conversion section 40G, and an insulating layer 45 is provided between the green photoelectric conversion section 40G and the blue photoelectric conversion section 40B. Light of red (e.g., wavelength of 600 nm or more and less than 700 nm) is selectively absorbed in the red photoelectric conversion section 40R; light of green (e.g., wavelength of 480 nm or more and less than 600 nm) is selectively absorbed in the green photoelectric conversion section 40G; and light of blue (e.g., wavelength of 400 nm or more and less than 480 nm) is selectively absorbed in the blue photoelectric conversion section 40B, generating electron-hole pairs.

The first electrode 41R extracts signal charges generated in the organic photoelectric conversion layer 42R; the first electrode 41G extracts signal charges generated in the organic photoelectric conversion layer 42G; and the first electrode 41B extracts signal charges generated in the organic photoelectric conversion layer 42B. The first electrodes 41R, 41G, and 41B are each provided for each pixel, for example. These first electrodes 41R, 41G, and 41B each include, for example, a light-transmissive electrically-conductive material, specifically, ITO. The first electrodes 41R, 41G, and 41B may each include, for example, a tin oxide-based material or a zinc oxide-based material. The tin oxide-based material is obtained by doping tin oxide with a dopant. Examples of the zinc oxide-based material include aluminum zinc oxide in which aluminum is added to zinc oxide as a dopant, gallium zinc oxide in which gallium is added to zinc oxide as a dopant, indium zinc oxide in which indium is added to zinc oxide as a dopant, and the like. Alternatively, it is also be possible to use IGZO, CuI, InSbO$_4$, ZnMgO, CuInO$_2$, MgIn$_2$O$_4$, CdO, ZnSnO$_3$, and the like. The thickness of each of the first electrodes 41R, 41G, and 41B is, for example, 50 nm to 500 nm.

For example, respective electron transport layers may be provided between the first electrode 41R and the organic photoelectric conversion layer 42R, between the first electrode 41G and the organic photoelectric conversion layer 42G, and between the first electrode 41B and the organic photoelectric conversion layer 42B. The electron transport layers serve to facilitate electrons generated in the organic photoelectric conversion layers 42R, 42G, and 42B to be supplied to the first electrodes 41R, 41G, and 41B, and each include, for example, titanium oxide, zinc oxide, or the like. The electron transport layers may each include titanium oxide and zinc oxide that are stacked. The thickness of each of the electron transport layers is, for example, 0.1 nm to 1000 nm, and preferably 0.5 nm to 300 nm.

The organic photoelectric conversion layers 42R, 42G, and 42B each absorb light in a selective wavelength region for photoelectric conversion, and transmit light in another wavelength region. Here, the light in the selective wavelength region is, for example, light in a wavelength region of a wavelength of 600 nm or more and less than 700 nm in the organic photoelectric conversion layer 42R, light in a wavelength region of a wavelength of 480 nm or more and less than 600 nm, for example, in the organic photoelectric conversion layer 42G, and light in a wavelength region of a wavelength of 400 nm or more and less than 480 nm, for example, in the organic photoelectric conversion layer 42B. The thickness of each of the organic photoelectric conversion layers 42R, 42G, and 42B is, for example, 50 nm or more and less than 500 nm.

The organic photoelectric conversion layers 42R, 42G, and 42B each include, for example, two or more types of organic semiconductor materials, and preferably includes, for example, one or both of a p-type semiconductor and an n-type semiconductor, similarly to the organic photoelectric conversion layer 16 in the above-described embodiment. For example, in a case where each of the organic photoelectric conversion layers 42R, 42G, and 42B includes the two types of organic semiconductor materials including a p-type semiconductor and an n-type semiconductor, for example, one of the p-type semiconductor and the n-type semiconductor is preferably a material having transmissivity to visible light, and the other thereof is preferably a material that photoelectrically converts light in a selective wavelength region (e.g., 450 nm or more and 650 nm or less). Alternatively, each of the organic photoelectric conversion layers 42R, 42G, and 42B preferably includes three types of organic semiconductor materials including a material (light absorber), an n-type semiconductor, and a p-type semiconductor. The material (light absorber) photoelectrically converts light in a selective wavelength region corresponding to each layer. The n-type semiconductor and the p-type semiconductor each have light-transmissivity to visible light.

Each of the organic photoelectric conversion layers 42R, 42G, and 42B has a bulk heterostructure in which the plurality of these organic semiconductor materials is randomly mixed in the layer. In the present modification example, at least one of the organic photoelectric conversion layers 42R, 42G, and 42B has a configuration in which a domain (e.g., domain Dp) having a configuration similar to that of the organic photoelectric conversion layer 16 according to the above-described embodiment is formed in the layer.

For example, respective hole transport layers may be provided between the organic photoelectric conversion layer 42R and the second electrode 43R, between the organic photoelectric conversion layer 42G and the second electrode 43G, and between the organic photoelectric conversion layer 42B and the second electrode 43B. The hole transport layers serve to facilitate holes generated in the organic photoelectric conversion layers 42R, 42G, and 42B to be supplied to the second electrodes 43R, 43G, and 43B, and each include, for example, molybdenum oxide, nickel oxide, vanadium oxide, or the like. The hole transport layers may each include an organic material such as PEDOT (Poly(3,4-ethylenedioxythiophene) and TPD (N,N'-Bis(3-methylphenyl)-N,N'-diphenylbenzidine). The thickness of each of the hole transport layers is, for example, 0.5 nm or more and 100 nm or less.

The second electrode 43R serves to extract holes generated in the organic photoelectric conversion layer 42R; the second electrode 43G serves to extract holes generated in the organic photoelectric conversion layer 42G; and the second electrode 43B serves to extract holes generated in the organic photoelectric conversion layer 42G. The holes extracted from the second electrodes 43R, 43G, and 43B are discharged to, for example, a p-type semiconductor region (not illustrated) in the silicon substrate 81 via respective transmission paths (not illustrated). The second electrodes 43R, 43G, and 43B each include, for example, an electrically-conductive material such as gold, silver, copper, and aluminum. Similarly to the first electrodes 41R, 41G, and 41B, the second electrodes 43R, 43G, and 43B may each include a transparent electrically-conductive material. In the photoelectric conversion element 20, holes extracted from these second electrodes 43R, 43G, and 43B are discharged. Therefore, for example, when the plurality of photoelectric conversion elements 20 is disposed in the solid-state imaging device 1 described below, the second electrodes 43R, 43G, and 43B may be provided in common for each of the photoelectric conversion elements 20 (unit pixel P). The thickness of each of the second electrodes 43R, 43G, and 43B is, for example, 0.5 nm or more and 100 nm or less.

The insulating layer 44 serves to insulate the second electrode 43R and the first electrode 41G from each other, and the insulating layer 45 serves to insulate the second electrode 43G and the first electrode 41B from each other. The insulating layers 44 and 45 each include, for example, a metal oxide, a metal sulfide, or an organic material. Examples of the metal oxide include silicon oxide, aluminum oxide, zirconium oxide, titanium oxide, zinc oxide, tungsten oxide, magnesium oxide, niobium oxide, tin oxide, gallium oxide, and the like. Examples of the metal sulfide include zinc sulfide, magnesium sulfide, and the like. The band gap of a material included in each of the insulating layers 44 and 45 is preferably 3.0 eV or more. The thickness of each of the insulating layers 44 and, 45 is, for example, 2 nm or more and 100 nm or less.

As described above, an organic semiconductor material is used that forms a domain having a percolation structure and having a shape in which the length of the domain in the plane direction is less than the length of the domain in the film-thickness direction in at least one of the organic photoelectric conversion layers 42R, 42G, and 42B. In the percolation structure, the domain vertically extends in the organic photoelectric conversion layer (e.g., organic photoelectric conversion layer 42R) in the film-thickness direction. This causes organic semiconductor materials (e.g., an n-type semiconductor and a light absorber in addition to the above-described p-type semiconductor) included in an organic photoelectric conversion layer (e.g., organic photoelectric conversion layer 42R) to be controlled in an appropriate mixture state. This makes it possible to increase the external quantum efficiency and response speed.

3. Application Examples

Application Example 1

Figure 8:
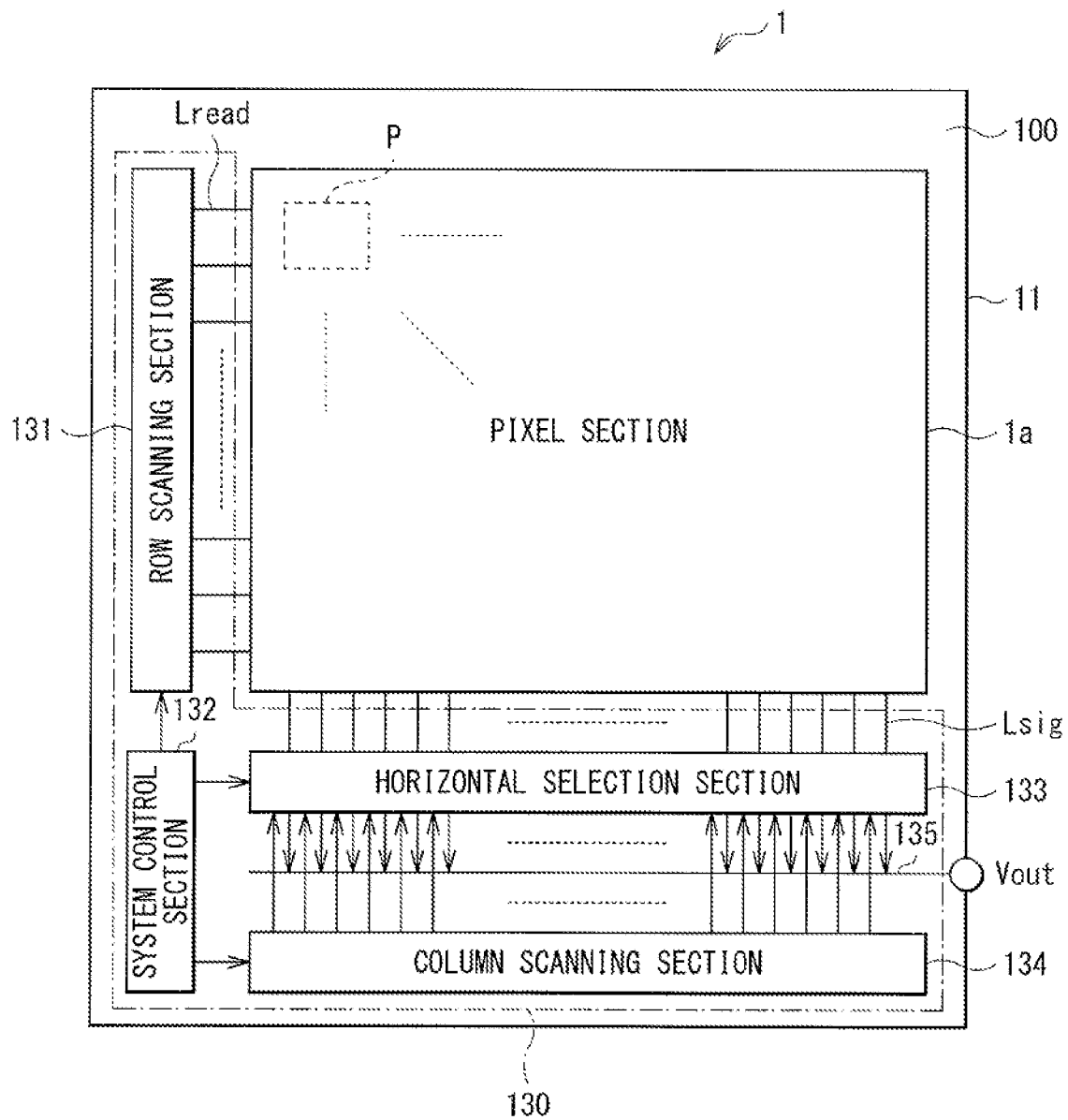
FIG. 8 is a block diagram illustrating an overall configuration of a solid-state imaging element including the photoelectric conversion element illustrated in FIG. 1.

FIG. 8 illustrates, for example, an overall configuration of the solid-state imaging device 1 including the photoelectric conversion element 10 described in the above-described embodiment for each pixel. This solid-state imaging device 1 is a CMOS image sensor. The solid-state imaging device 1 includes, on the semiconductor substrate 11, the pixel section 1a as an imaging area, and a peripheral circuit unit 130 in a peripheral region of this pixel section 1a. The peripheral circuit unit 130 includes, for example, a row scanning section 131, a horizontal selection section 133, a column scanning section 134, and a system control section 132.

The pixel section 1a includes, for example, a plurality of unit pixels P (corresponding to, for example, the photoelectric conversion elements 10) that are two-dimensionally disposed in matrix. In these unit pixels P, pixel drive lines Lread (specifically, row selection lines and reset control lines) are disposed at each of pixel rows, for example, and vertical signal lines Lsig are disposed at each of pixel columns. The pixel drive lines Lread are each used to transmit drive signals for reading signals from pixels. One end of each of the pixel drive lines Lread is coupled to the output end of the row scanning section 131 corresponding to each row.

The row scanning section 131 is a pixel drive section that includes a shift register, an address decoder, and the like, and drives each of the unit pixels P of the pixel section 1a on a row basis, for example. A signal outputted from each of the unit pixels P of the pixel rows selected and scanned by the row scanning section 131 is supplied to the horizontal selection section 133 through each of the vertical signal lines Lsig. The horizontal selection section 133 includes an amplifier, a horizontal selection switch, and the like provided for each of the vertical signal lines Lsig.

The column scanning section 134 includes a shift register, an address decoder, and the like, and drives each of the horizontal selection switches of the horizontal selection section 133 in sequence while scanning the horizontal selection switches. Selection and scanning by this column scanning section 134 output signals of the respective pixels transmitted through each of the vertical signal lines Lsig to a horizontal signal line 135 in sequence, and transmits the signals to the outside of the semiconductor substrate 11 through the horizontal signal line 135.

Circuit portions including the row scanning section 131, the horizontal selection section 133, the column scanning section 134, and the horizontal signal line 135 may be formed directly on the semiconductor substrate 11 or may be disposed on external control IC. In addition, those circuit portions may be formed on another substrate coupled by a cable or the like.

The system control section 132 receives, for example, a clock, data for an instruction about an operation mode, and the like. The clock and the data are supplied from the outside of the semiconductor substrate 11. In addition, the system control section 132 outputs data such as internal information of the solid-state imaging device 1. The system control section 132 further includes a timing generator that generates various timing signals, and controls the driving of the peripheral circuit such as the row scanning section 131, the horizontal selection section 133, and the column scanning section 134 on the basis of the various timing signals generated by the timing generator.

Application Example 2

Figure 9:
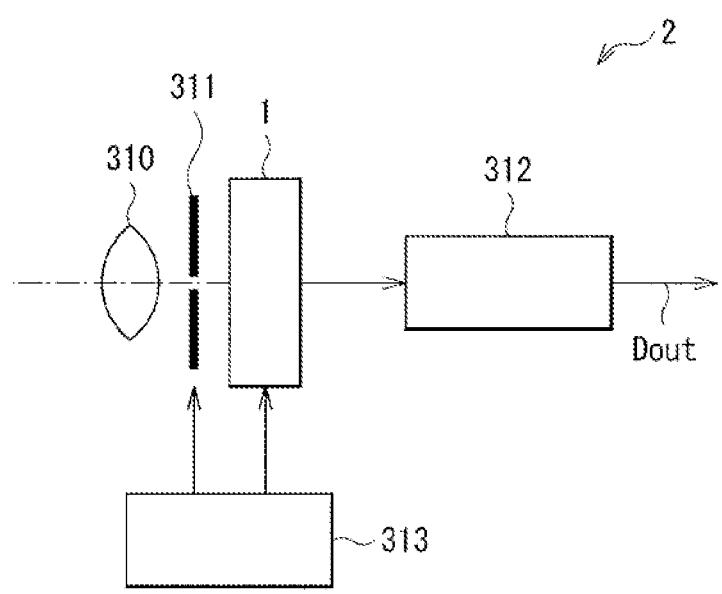
FIG. 9 is a functional block diagram illustrating an example of a solid-state imaging device (camera) including the solid-state imaging element illustrated in FIG. 8.

The above-described solid-state imaging device 1 is applicable to, for example, any type of electronic apparatus (solid-state imaging device) having an imaging function. The electronic apparatus (solid-state imaging device) includes a camera system such as a digital still camera and a video camera, a mobile phone having the imaging function, and the like. FIG. 9 illustrates a schematic configuration of a camera 2 as an example thereof. This camera 2 is, for example, a video camera that is able to capture a still image or a moving image. The camera 2 includes the solid-state imaging device 1, an optical system (optical lens) 310, a shutter device 311, a drive section 313 that drives the solid-state imaging device 1 and the shutter device 311, and a signal processing section 312.

The optical system 310 guides image light (incident light) from an object to the pixel section 1a of the solid-state imaging device 1. This optical system 310 may include a plurality of optical lenses. The shutter device 311 controls a period of time in which the solid-state imaging device 1 is irradiated with light and a period of time in which light is blocked. The drive section 313 controls a transfer operation of the solid-state imaging device 1 and a shutter operation of the shutter device 311. The signal processing section 312 performs various types of signal processing on signals outputted from the solid-state imaging device 1. An image signal Dout subjected to the signal processing is stored in a storage medium such as a memory or outputted to a monitor or the like.

Application Example 3

<Example of Application to In-Vivo Information Acquisition System>

Further, the technology (present technology) according to the present disclosure is applicable to various products. For example, the technology according to the present disclosure may be applied to an endoscopic surgery system.

Figure 10:
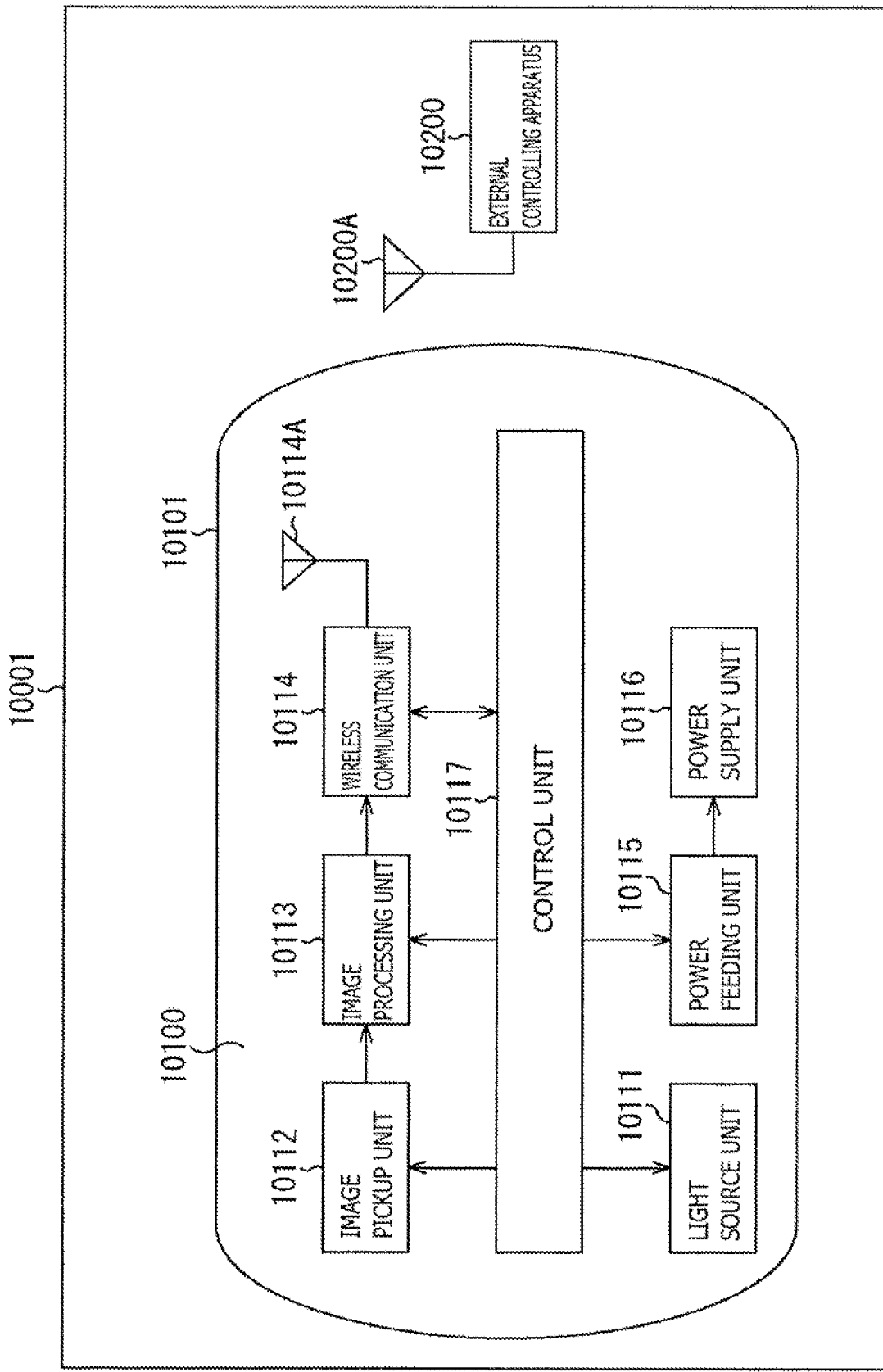
FIG. 10 is a block diagram depicting an example of a schematic configuration of an in-vivo information acquisition system.

FIG. 10 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 10, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure may be applied has been described above. The technology according to the present disclosure may be applied, for example, to the image pickup unit 10112 among the components described above. This makes it possible to increase the detection accuracy.

Application Example 4

4. Example of Application to Endoscopic Surgery System

The technology (present technology) according to the present disclosure is applicable to various products. For example, the technology according to the present disclosure may be applied to an endoscopic surgery system.

Figure 11:
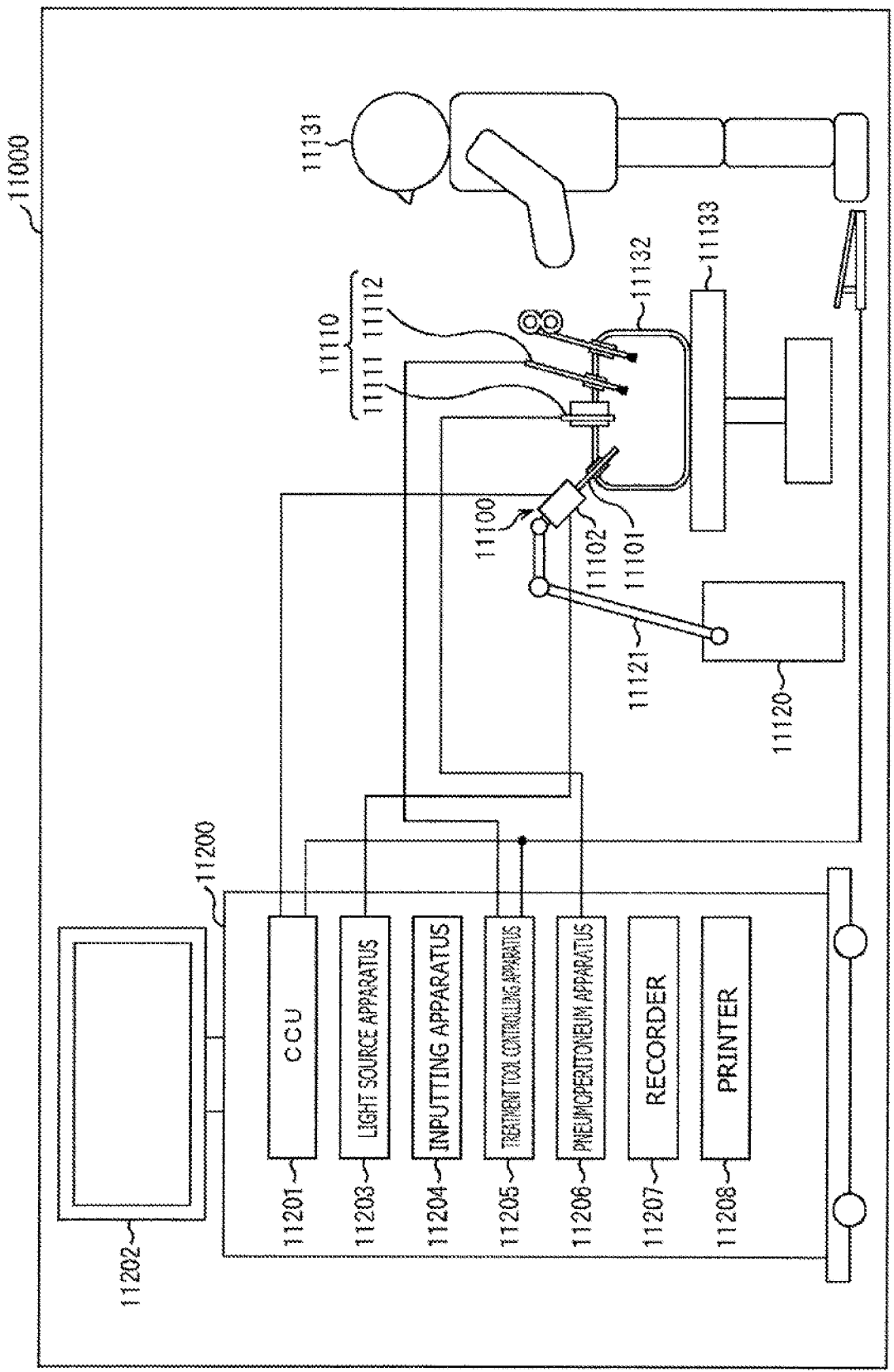
FIG. 11 is a view depicting an example of a schematic configuration of an endoscopic surgery system.

FIG. 11 is a view depicting an example of a schematic configuration of an endoscopic surgery system to which the technology according to an embodiment of the present disclosure (present technology) can be applied.

In FIG. 11, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 12:
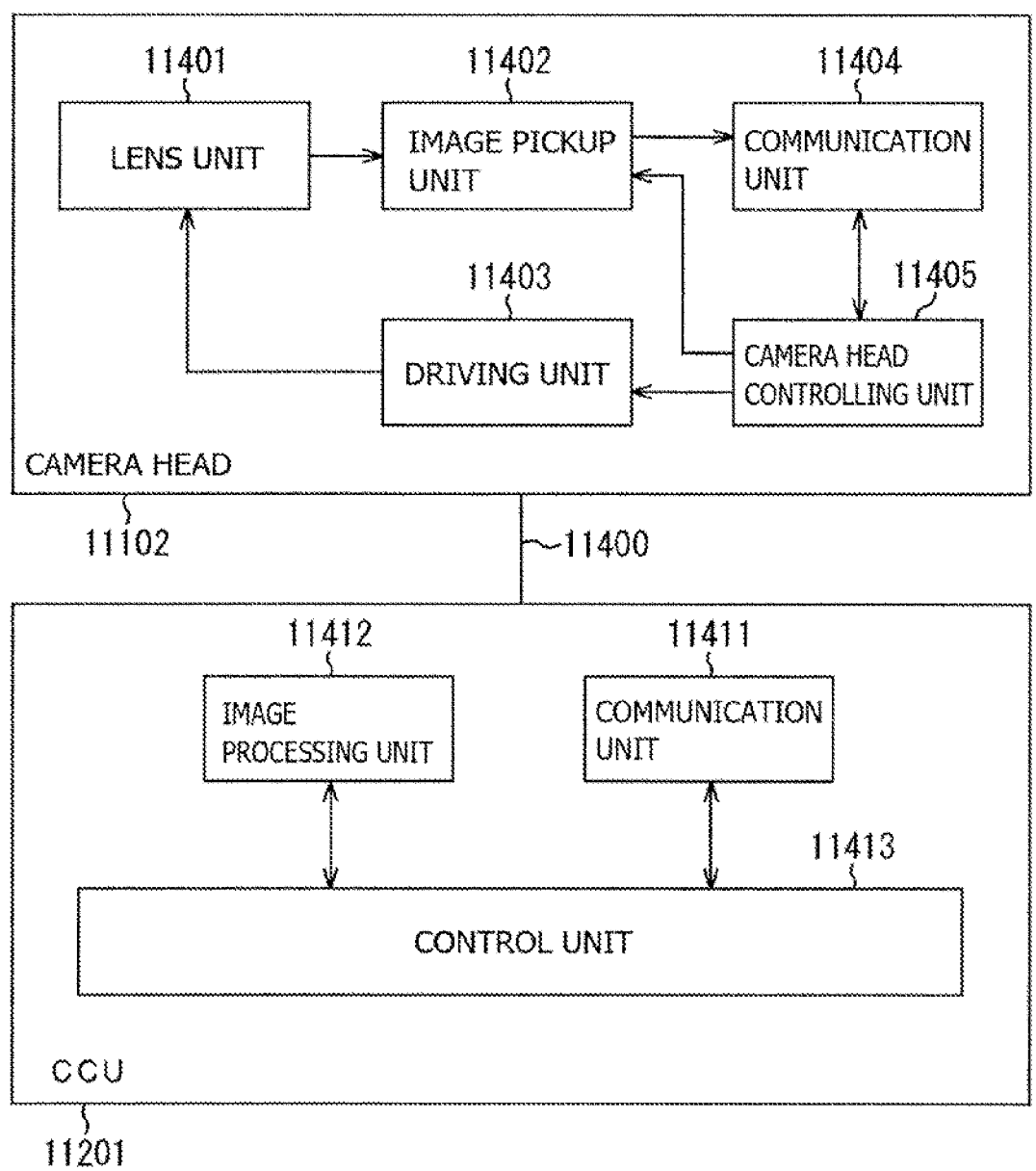
FIG. 12 is a block diagram depicting an example of a functional configuration of a camera head and a camera control unit (CCU).

FIG. 12 is a block diagram depicting an example of a functional configuration of the camera head 11102 and the CCU 11201 depicted in FIG. 11.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to the present disclosure may be applied to the image pickup unit 11402 among the components described above. Applying the technology according to an embodiment of the present disclosure to the image pickup unit 11402 increases the detection accuracy.

It is to be noted that the endoscopic surgery system has been described here as an example, but the technology according to the present disclosure may be additionally applied to, for example, a microscopic surgery system or the like.

Application Example 5

<Example of Application to Mobile Body>

The technology according to the present disclosure is applicable to various products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

Figure 13:
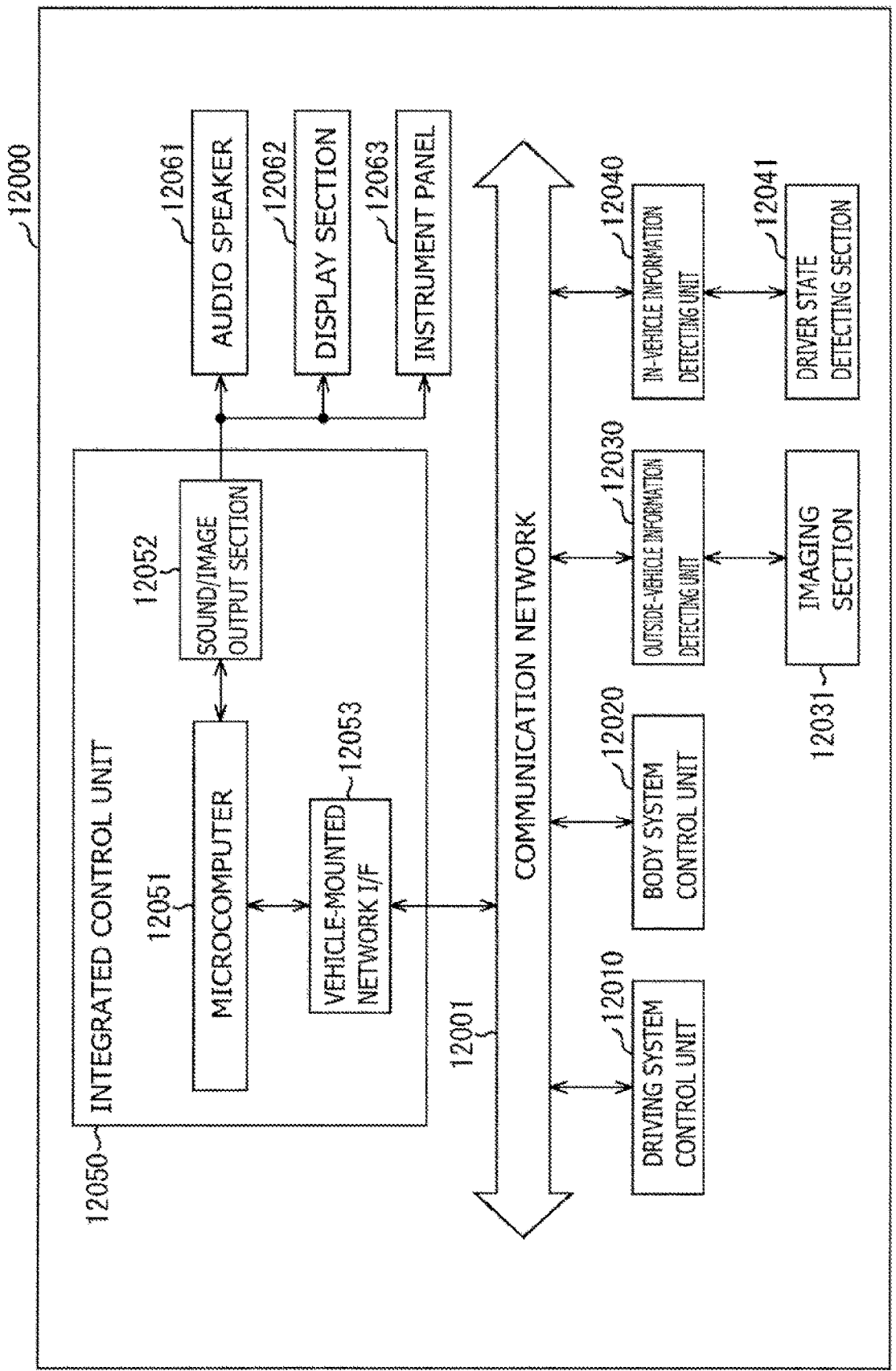
FIG. 13 is a block diagram depicting an example of schematic configuration of a vehicle control system.

FIG. 13 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

Figure 14:
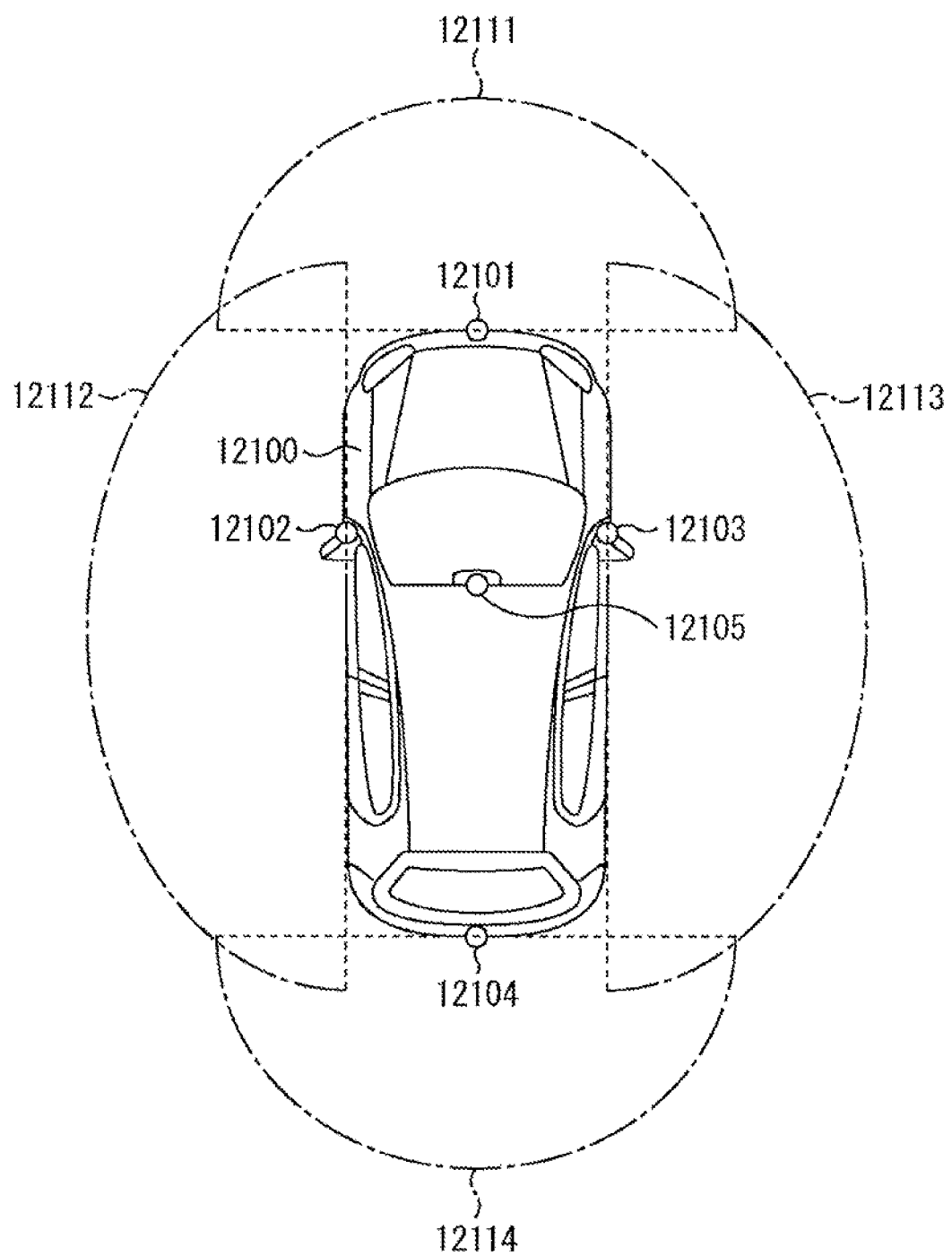
FIG. 14 is a diagram of assistance in explaining an example of installation positions of an outside-vehicle information detecting section and an imaging section.

FIG. 14 is a diagram depicting an example of the installation position of the imaging section 12031.

In FIG. 14, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

4. Working Examples

Next, working examples of the present disclosure are described.

(Evaluation of Electric Characteristic)

First, after a Si substrate with an ITO electrode (lower electrode) having a thickness of 50 nm was cleaned in a UV/ozone process, an organic photoelectric conversion layer was deposited at a substrate temperature of 40° C. in a resistance heating method while rotating a substrate holder in vacuum of $1 \times 10^{-5}$ Pa or less. For a material of the organic photoelectric conversion layer, 3, 6BP-BBTN in Expression (1) below was used as a hole transporting material (P material), a subphthalocyanine derivative ($F_6$-SubPc-$OPh_{26}F_2$) was used as a light absorber, and fullerene C60 was used as an electron transporting material (N material), which were concurrently deposited. A ratio of a deposition speed was 3, 6BP-BBTN:$F_6$-SubPc-$OPh_{26}F_2$:C60=4:4:2. Film formation was so performed that the total film thickness was 230 nm. Subsequently, B4PyPMP was deposited with a thickness of 5 nm in a vacuum deposition method at a substrate temperature of 0° C. as a buffer layer on the photoelectric conversion layer. Next, as the upper electrode 17, a film of ITO was formed by sputtering to have a thickness of 100 nm, and then subjected to heating treatment at 160° C. Thereby, a photoelectric conversion element (Experiment Example 1) having a photoelectric conversion region of 1 mm×1 mm was fabricated.

Additionally, photoelectric conversion elements serving as Experiment Examples 2 to 8 were fabricated. In Experiment Examples 2 and 3, photoelectric conversion elements were fabricated by using a method similar to that of Experiment Example 1 except that the organic photoelectric conversion layers were formed at substrate temperatures of 25° C. (Experiment Example 2) and 0° C. (Experiment Example 3). In Experiment Example 4, a photoelectric conversion element was fabricated by using a method similar to that of Experiment Example 3 except that heating treatment was omitted (As depo) after the organic film was formed (after the buffer layer was formed). In Experiment Example 5, a photoelectric conversion element was fabricated by using a method similar to that of Experiment Example 3 except that BP-ChDT (Expression (2)) was used as a P material. In Experiment Examples 6, 7, and 8, photoelectric conversion elements were fabricated by using DBPA (Expression (3)) as P materials and setting −10° C. and ANL 160° C. (Experiment Example 6), −10° C. and As depo (Experiment Example 7), and 40° C. and ANL 160° C. (Experiment Example 8) as the respective substrate temperatures when the organic photoelectric conversion layers were formed and the respective heating treatment conditions after the organic films were formed.

[Chem. 1]

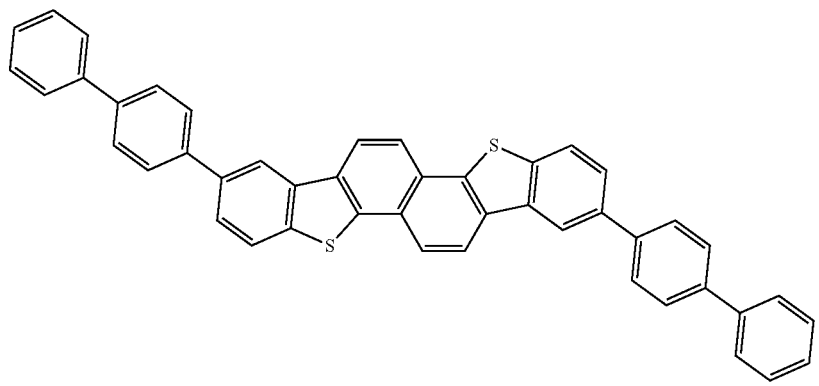

3.6BP-BBTN (1)

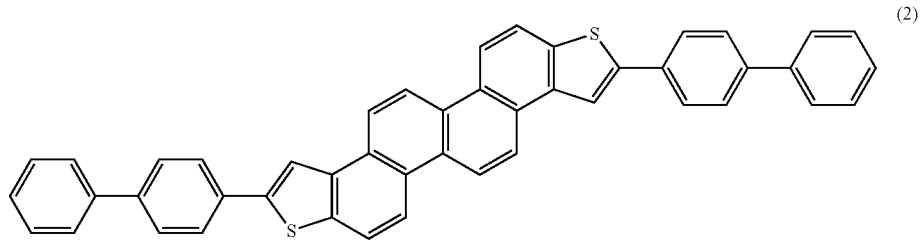

BP-CbDT (2)

-continued

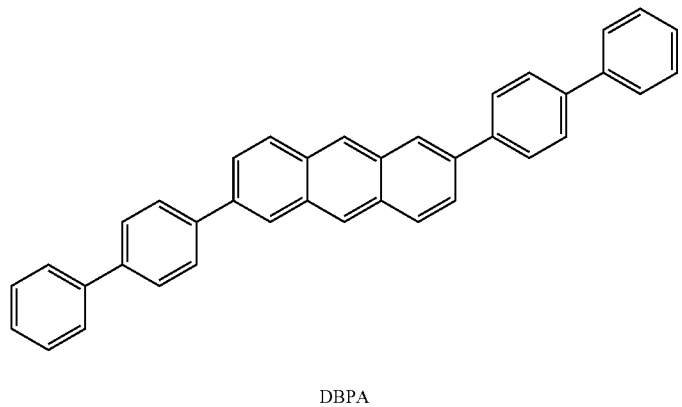

(3)

DBPA

The responsiveness (afterimage characteristics) of Experiment Examples 1 to 8 were evaluated. The afterimage characteristics were evaluated by measuring a rate at which the bright current value observed at the time of light irradiation fell after the light irradiation was stopped using the semiconductor parameter analyzer. Specifically, the amount of light with which the photoelectric conversion element was irradiated from the light source via the filter was set at 1.62 W/cm$_2$, and the bias voltage to be applied between the electrodes was set at −2.6 V. After a steady current was observed in this state, the light irradiation was stopped and the current was observed to decay. Thereafter, with the area surrounded by a current-time curve and the dark current set as 100%, the time elapsed before the area becomes 3% was considered as an index of the responsiveness. All the evaluations were performed at a room temperature.

In addition, the quantum efficiency (external quantum efficiency; EQE) of Experiment Examples 1 to 8 was evaluated by using a semiconductor parameter analyzer. Specifically, the external photoelectric conversion efficiency was calculated from a bright current value and a dark current value in a case where the amount of light (LED light having a wavelength of 560 nm) with which the photoelectric conversion element is irradiated from the light source via the filter was set at 1.62 μW/cm$^2$ and the bias voltage to be applied between the electrodes was set to −2.6 V.

(Transmission Electron Microscope (TEM) Analysis)

In addition, TEM observation samples of the cross sections of the organic photoelectric conversion layers corresponding to Experiment Examples 1 to 8 were fabricated, and the P material domains in the organic photoelectric conversion layers were observed. The domains of the P materials (organic semiconductor materials each having the hole transporting property) were confirmed by observing transmission images with a transmission electron microscope.

First, a thin sample was fabricated from the region of the organic photoelectric conversion layer of the sample of Experiment Example 1 above by using a focused ion beam (Focused Ion Beam; FIB, HELIOS NANOLAB 400S manufactured by FEI), and then a damaged layer of an FIB-processed end surface was removed by an ion milling machine (Model 1040 manufactured by Fischione). TEM (JEM-300F manufactured by JEOL) observed a transmission image at an accelerating voltage of 300 kV in the state of low irradiation electron beams. The transmission image was observed with the transmission image out of focus, that is, deviated by approximately 1500 nm from the just focus position onto the underside as a defocus condition for observing a domain. Additionally, similar methods were used to perform the transmission microscope analyses of Experiment Examples 2 to 8 above.

TABLE 1

| | | Film formation | | Electric characteristic | | Interference fringe | | |
| --- | --- | --- | --- | --- | --- | --- | --- | --- |
| | P material | substrate temperature (° C.) | Heating treatment condition | Afterimage characteristic (ms) | EQE (%) | Length (ms) | Angle (°) | Number of lines |
| Experiment Example 1 | 3, 6BP-BBTN | 40 | ANL 160° C. | 1.3 | 80.4 | 117.9 | 87.1 | 4 |
| Experiment Example 2 | 3, 6BP-BBTN | 25 | ANL 160° C. | 3.5 | 79.8 | 61.4 | 86.6 | 2 |
| Experiment Example 3 | 3, 6BP-BBTN | 0 | ANL 160° C. | 7.8 | 62.3 | 31.6 | 49.7 | 2 |
| Experiment Example 4 | 3, 6BP-BBTN | 0 | As depo | 8.1 | 61.8 | — | — | — |
| Experiment Example 5 | BP-ChDT | 0 | ANL 160° C. | 0.16 | 85.1 | 90.0 | 83.1 | 2 |
| Experiment Example 6 | DBPA | −10 | ANL 160° C. | 3.5 | 88% | 101.2 | 82.1 | 3 |
| Experiment Example 7 | DBPA | −10 | As depo | 4.1 | 72.8 | 45.8 | 63.7 | 2 |
| Experiment Example 8 | DBPA | 40 | ANL 160° C. | >1000 | Considerably degraded | 107.7 | 71.9 | 10 |

Figure 15:
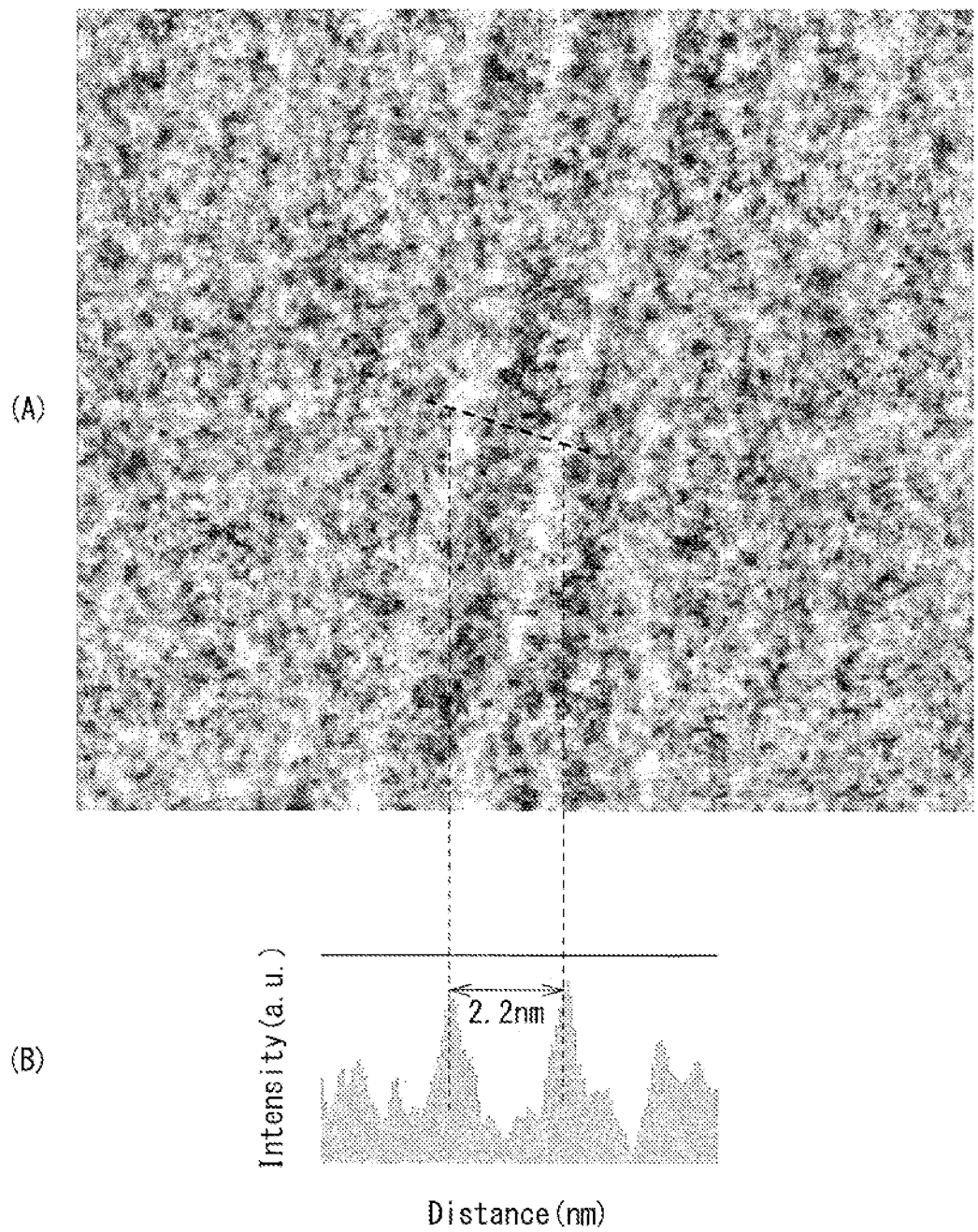
FIG. 15 is a diagram illustrating a TEM image (A) of Experiment Example 1 and signal intensity (B) thereof.

FIG. 15 includes a TEM image (A) in which an interference fringe portion of Experiment Example 1 is enlarged, and (B) obtained by measuring the signal intensity of the TEM image by TEM image software (Digital Micrograph). The interference fringe of the TEM image appears as a peak of high points or low points of the signal intensity in accordance with the strength of contrast thereof. As described above, paired adjacent lines included in interference fringe represent the molecular period of the P material in the major axis direction. While the P material used in Experiment Example 1 had a molecular length of approximately 3 nm, paired lines included in the interference fringe in FIG. 15(B) had an interval of 2.2 nm. This allows the interference fringe to be paraphrased with an interference fringe having the period of the P material in the major axis direction.

Figure 16:
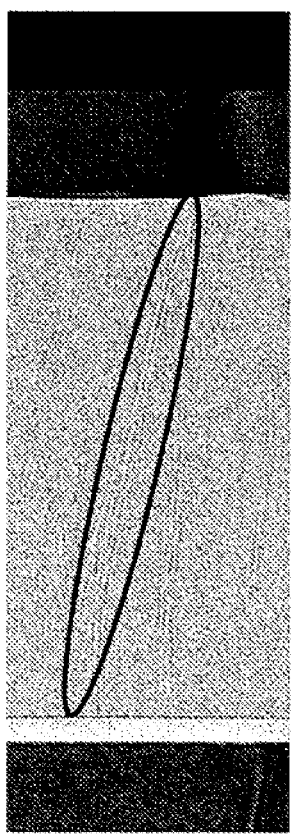
FIG. 16 includes TEM images of Experiment Examples 1 and 4.
Figure 16:
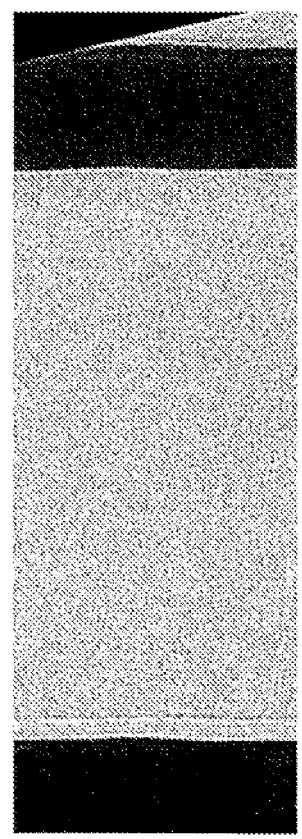
Figure 17:
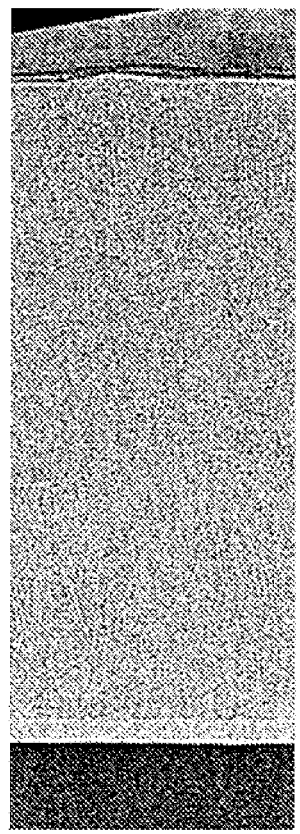
FIG. 17 includes TEM images of Experiment Examples 6 and 8.
Figure 17:
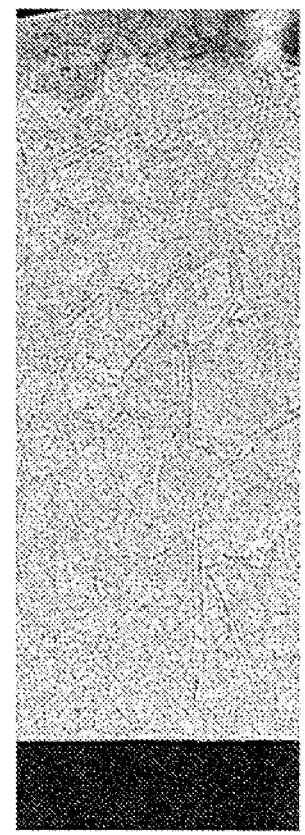

FIG. 16 illustrates respective TEM images of Experiment Example 1 (A) and Experiment Example 4 (B). FIG. 17 illustrates respective TEM images of Experiment Example 6 (A) and Experiment Example 8 (B). Table 1 tabulates the P materials used in Experiment Examples 1 to 8, the conditions for forming the organic photoelectric conversion layers, and the respective electric characteristics and transmission microscope analysis results. In Experiment Examples 1 and 4 in which 3, 6BP-BBTN was used as P materials. In Experiment Example 1 in which heating treatment was performed at 160° C. after an organic film was formed, an interference fringe was observed that indicated a domain extending in the film-thickness direction (e.g., in the circle in FIG. 16(A)). In Experiment Example 4 in which no heating treatment was performed (As depo) after an organic film was formed, no interference fringe was observed. Experiment Example 1 offered a more improved afterimage characteristic than Experiment Example 4, and further offered increased quantum efficiency. This made clear the effectiveness of a domain in an organic photoelectric conversion layer. In addition, in Experiment Example 3 in which BP-ChDT was used as a P material, and an excellent afterimage characteristic and quantum efficiency were offered, a domain was also confirmed that extends in the film-thickness direction. This indicated that the formation of a domain extending in the film-thickness direction was significant for improvement in an electric characteristic.

In contrast, in Experiment Example 6 in which DBPA was used as a P material, and an organic photoelectric conversion layer was formed at 40° C., a domain was certainly confirmed in the organic photoelectric conversion layer, but an afterimage characteristic and quantum efficiency were both considerably degraded. In Experiment Example 8, a large number (ten or more) of interference fringes were confirmed. This indicated that too large a domain caused an electric characteristic to be degraded.

It is to be noted that it has been described in the above-described embodiment that the angle formed between an interference fringe and the electrode surface of the lower electrode 15 is preferably more than 450 and 900 or less, and the reason for this is as follows. In a case where a domain is formed in an organic photoelectric conversion layer, this domain serves as a charge transporting path. To more efficiently transport holes or electrons in the directions of the upper and lower electrodes, it is desirable to configure a domain extending vertical to the electrode surface. For example, a domain including a P material contributes to the transporting efficiency of holes, and this increases the response speed to offer a favorable afterimage characteristic. A relatively favorable afterimage characteristic is obtained in the present working example even if the angle formed between an interference fringe and the electrode surface is 49.7° (Experiment Example 3). As described above, it is preferable that the angle formed between an interference fringe and the electrode surface be more than 450 and less than 900 as the extending direction of the interference fringe. In addition, an angle of 630 or more and 900 or less is more preferable, and an angle of 820 or more and 900 or less is still more preferable.

In addition, it has been described in the above-described embodiment that the interval between two adjacent lines included in an interference fringe preferably falls within ±50% of the molecular length of a p-type semiconductor, and the reason for this is as follows. While the molecular length of the 3, 6BP-BBTN used in Experiment Example 1 in the major axis direction is approximately 3 nm, the interval of the interference fringe is 2.2 nm, resulting in a difference of approximately 27%. A major factor in this difference is a molecular length axis that is not vertical to the extending direction of the interference fringe or the direction for transmitting electrons, but inclined. In a case where the molecular length axis is inclined with respect to the electrode surface, the interval between paired lines included in the interference fringe is shorter than the molecular length. Further, the possible variable factors caused by the focus amount of a transmission electron microscope are as follows. As a first factor, an image of the transmission electron microscope is blurred in different ways in accordance with a defocus amount, and a larger defocus amount prolongs the interval between paired lines included in the interference fringe. As a second factor, the defocus amount varies in accordance with an error of a position with no defocus. As a benchmark, a defocus amount of 0 is determined from the position of the weakest contrast by visually confirming the contrast of an end of a sample while changing the height of the sample. As a third factor, a focus amount depends on the position of a p-type semiconductor in a sample, thereby varying the interval between paired lines. As described above, it is preferable that the interval between two adjacent lines included in an interference fringe fall within ±50% of the molecular length of the p-type semiconductor.

Description has been given above by referring to the embodiment, the modification example, and the working examples, but the content of the present disclosure is not limited to the above-described embodiment and the like, and various modifications are possible. For example, in the above-described embodiment, the photoelectric conversion element has a configuration in which the organic photoelectric conversion section 11G that detects green light, and the inorganic photoelectric conversion section 11B and the inorganic photoelectric conversion section 11R that detect blue light and red light, respectively, are stacked. However, the content of the present disclosure is not limited to such a structure. That is, the organic photoelectric conversion section may detect the red light or the blue light, or the inorganic photoelectric conversion sections may detect the green light.

In addition, the number of these organic photoelectric conversion sections and inorganic photoelectric conversion sections or a proportion thereof are not limited. The two or more organic photoelectric conversion sections may be provided or color signals of a plurality of colors may be obtained with the organic photoelectric conversion section alone. Further, a structure is not limited to the structure in which the organic photoelectric conversion section and the inorganic photoelectric conversion sections are stacked in the vertical direction, but the organic photoelectric conversion section and the inorganic photoelectric conversion sections may be placed side by side along a substrate surface.

Moreover, the above-described embodiment or the like exemplifies the configuration of the backside illumination type solid-state imaging device, but the content of the present disclosure is also applicable to a solid-state imaging device of a front surface illumination type. In addition, the photoelectric conversion element of the present disclosure does not necessarily have to include all of the components described in the embodiment above, and may include another layer, conversely.

It is to be noted that the effects described herein are merely examples, but not limitative. In addition, there may be other effects.

It is to be noted that the present disclosure may have the following configurations.

(1)
A photoelectric conversion element including:
a first electrode;
a second electrode disposed to be opposed to the first electrode; and
an organic photoelectric conversion layer provided between the first electrode and the second electrode, the organic photoelectric conversion layer having a domain of one organic semiconductor material therein,
the domain of the one organic semiconductor material having a percolation structure in which the domain vertically extends in the organic photoelectric conversion layer in a film-thickness direction, and having a smaller domain length in a plane direction of the organic photoelectric conversion layer than a domain length in the film-thickness direction of the organic photoelectric conversion layer.

(2)
The photoelectric conversion element according to (1), in which
the organic photoelectric conversion layer has an interference fringe in a cross-sectional photograph in the film-thickness direction, the cross-sectional photograph being taken by a transmission electron microscope under a defocus condition, the interference fringe including two or more lines, and
an interval between the two or more lines included in the interference fringe falls within ±50% of a molecular length of the one organic semiconductor material.

(3)
The photoelectric conversion element according to (2), in which the interference fringe has a length of 20 nm or more.

(4)
The photoelectric conversion element according to (2) or (3), in which an angle formed between the interference fringe and an electrode surface of the first electrode is more than 45° and 90° or less.

(5)
The photoelectric conversion element according to any of (2) to (4), in which the interference fringe includes less than ten lines.

(6)
The photoelectric conversion element according to any of (1) to (5), in which an interface between the organic photoelectric conversion layer and the second electrode has a surface roughness of 10 nm or less.

(7)
The photoelectric conversion element according to any of (1) to (6), in which the one organic semiconductor material has a hole transporting property.

(8)
A solid-state imaging device including
pixels each including one or more organic photoelectric conversion sections,
the organic photoelectric conversion sections each include
a first electrode,
a second electrode disposed to be opposed to the first electrode, and
an organic photoelectric conversion layer provided between the first electrode and the second electrode, the organic photoelectric conversion layer having a domain of one organic semiconductor material therein,
the domain of the one organic semiconductor material having a percolation structure in which the domain vertically extends in the organic photoelectric conversion layer in a film-thickness direction, and having a smaller domain length in a plane direction of the organic photoelectric conversion layer than a domain length in the film-thickness direction of the organic photoelectric conversion layer.

(9)
The solid-state imaging device according to (8), in which the one or more organic photoelectric conversion sections and one or more inorganic photoelectric conversion sections are stacked in each pixel, the one or more inorganic photoelectric conversion sections each performing photoelectric conversion in a wavelength region different from wavelength regions of the organic photoelectric conversion sections.

(10)
The solid-state imaging device according to (9), in which
the inorganic photoelectric conversion sections are each embedded and formed in a semiconductor substrate, and
the organic photoelectric conversion sections are each formed on a first surface side of the semiconductor substrate.

(11)
The solid-state imaging device according to (10), in which a multilayer wiring layer is formed on a second surface side of the semiconductor substrate.

(12)
The solid-state imaging device according to (10) or (11), in which
the organic photoelectric conversion sections each photoelectrically convert green light, and
an inorganic photoelectric conversion section that photoelectrically converts blue light and an inorganic photoelectric conversion section that photoelectrically converts red light are stacked in the semiconductor substrate.

(13)
The solid-state imaging device according to any of (8) to (12), in which a plurality of the organic photoelectric conversion sections is stacked in each pixel, the plurality of the organic photoelectric conversion sections performing photoelectric conversion in respective wavelength regions different from each other.

This application claims the priority on the basis of Japanese Patent Application No. 2017-222977 filed with Japan Patent Office on Nov. 20, 2017, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photoelectric conversion element, comprising:
a first electrode;
a second electrode disposed to be opposed to the first electrode; and
an organic photoelectric conversion layer provided between the first electrode and the second electrode, the organic photoelectric conversion layer having a domain of one organic semiconductor material therein,
wherein the domain of the one organic semiconductor material has a smaller domain length in a plane direction of the organic photoelectric conversion layer than a domain length in a film-thickness direction of the organic photoelectric conversion layer, wherein the one organic semiconductor material has a hole transporting property, wherein the organic photoelectric conversion layer has an interference fringe in a cross-sectional photograph in the film-thickness direction, wherein the cross-sectional photograph is taken by a transmission electron microscope under a defocus condition, the interference fringe including two or more lines, and wherein an interval between the two or more lines included in the interference fringe falls within ±50% of a molecular length of the one organic semiconductor material.

2. The photoelectric conversion element according to claim 1, wherein the interference fringe has a length of 20 nm or more.

3. The photoelectric conversion element according to claim 1, wherein an angle formed between the interference fringe and an electrode surface of the first electrode is more than 45° and equal to or less than 90°.

4. The photoelectric conversion element according to claim 1, wherein, in the cross-sectional photograph in the film-thickness direction, the interference fringe includes less than ten lines.

5. The photoelectric conversion element according to claim 1, wherein an interface between the organic photoelectric conversion layer and the second electrode has a surface roughness of 10 nm or less.

6. A solid-state imaging device, comprising:
a plurality of pixels, each pixel in the plurality of pixels including one or more organic photoelectric conversion sections,
wherein the organic photoelectric conversion sections each include:
a first electrode;
a second electrode disposed to be opposed to the first electrode; and
an organic photoelectric conversion layer provided between the first electrode and the second electrode, the organic photoelectric conversion layer having a domain of one organic semiconductor material therein,
wherein the domain of the one organic semiconductor material having a smaller domain length in a plane direction of the organic photoelectric conversion layer than a domain length in a film-thickness direction of the organic photoelectric conversion layer, and the one organic semiconductor material has a hole transporting property, wherein the organic photoelectric conversion layer has an interference fringe in a cross-sectional photograph in the film-thickness direction, wherein the cross-sectional photograph is taken by a transmission electron microscope under a defocus condition, the interference fringe including two or more lines, and wherein an interval between the two or more lines included in the interference fringe falls within ±50% of a molecular length of the one organic semiconductor material.

7. The solid-state imaging device according to claim 6, wherein the one or more organic photoelectric conversion sections and one or more inorganic photoelectric conversion sections are stacked in each pixel, the one or more inorganic photoelectric conversion sections each performing photoelectric conversion in a wavelength region different from wavelength regions of the organic photoelectric conversion sections.

8. The solid-state imaging device according to claim 7, wherein the inorganic photoelectric conversion sections are each embedded and formed in a semiconductor substrate, and wherein the organic photoelectric conversion sections are each formed on a first surface side of the semiconductor substrate.

9. The solid-state imaging device according to claim 8, wherein a multilayer wiring layer is formed on a second surface side of the semiconductor substrate.

10. The solid-state imaging device according to claim 8, wherein the organic photoelectric conversion sections each photoelectrically convert green light, and wherein an inorganic photoelectric conversion section that photoelectrically converts blue light and an inorganic photoelectric conversion section that photoelectrically converts red light are stacked in the semiconductor substrate.

11. The solid-state imaging device according to claim 6, wherein a plurality of the organic photoelectric conversion sections is stacked in each pixel, the plurality of the organic photoelectric conversion sections performing photoelectric conversion in respective wavelength regions different from each other.

12. The solid-state imaging device according to claim 6, wherein the domain of the one organic semiconductor material has a percolation structure in which the domain vertically extends in the organic photoelectric conversion layer in the film-thickness direction.

* * * * *